United States Patent
Grissom et al.

(10) Patent No.: US 9,995,808 B2
(45) Date of Patent: Jun. 12, 2018

(54) MRI USING RF GRADIENTS FOR SPATIAL ENCODING

(71) Applicant: VANDERBILT UNIVERSITY, Nashville, TN (US)

(72) Inventors: William Grissom, Nashville, TN (US); Mark Does, Nashville, TN (US); Zhipeng Cao, Nashville, TN (US)

(73) Assignee: VANDERBILT UNIVERSITY, Nashville, KS (US)

( * ) Notice: Subject to any disclaimer, the term of this patent is extended or adjusted under 35 U.S.C. 154(b) by 598 days.

(21) Appl. No.: 14/642,843

(22) Filed: Mar. 10, 2015

(65) Prior Publication Data
US 2015/0253403 A1 Sep. 10, 2015

Related U.S. Application Data

(60) Provisional application No. 61/950,433, filed on Mar. 10, 2014.

(51) Int. Cl.
*G01V 3/00* (2006.01)
*G01R 33/483* (2006.01)
*G01R 33/46* (2006.01)

(52) U.S. Cl.
CPC ...... *G01R 33/4831* (2013.01); *G01R 33/4616* (2013.01)

(58) Field of Classification Search
USPC ........................................ 324/309
See application file for complete search history.

(56) References Cited

U.S. PATENT DOCUMENTS

| | | | | |
|---|---|---|---|---|
| 7,042,214 B2* | 5/2006 | Cunningham | ....... | G01R 33/446 324/307 |
| 8,082,127 B2* | 12/2011 | Ruhm | ................ | G01R 33/4824 324/300 |
| 2010/0315084 A1* | 12/2010 | Sacolick | ................ | A61B 5/055 324/309 |
| 2013/0134972 A1* | 5/2013 | Schulte | ................ | G01R 33/246 324/309 |
| 2013/0193966 A1* | 8/2013 | Larson | ............... | G01R 33/4608 324/309 |
| 2013/0320977 A1* | 12/2013 | Koehler | ................. | G01R 33/32 324/309 |
| 2014/0070805 A1* | 3/2014 | Van Der Meulen | . | G01R 33/246 324/309 |

(Continued)

OTHER PUBLICATIONS

D.I. Hoult, "NMR Imaging. Rotating frame selective pulses", Journal of Magnetic Resonance, 38:369-374, 1980.

(Continued)

*Primary Examiner* — Rodney Fuller
(74) *Attorney, Agent, or Firm* — Nixon Peabody LLP; Eduardo J. Quinones

(57) ABSTRACT

Systems and methods for performing MRI include using a RF gradient field for spatial encoding. In particular implementations, $|B^+_1|$-selective pulses designed using the Shinnar-Le Roux algorithm can be provided as the excitation pulse for the RF gradient field. Further, frequency encoding for the RF gradient field can be based on the Bloch-Siegert (BS) shift. Together, these techniques can be used to support MRI based on RF gradient encoding instead of the conventional Bo encoding.

20 Claims, 30 Drawing Sheets

(56) References Cited

U.S. PATENT DOCUMENTS

2016/0116558 A1* 4/2016 Grodzki ............ G01R 33/4833
324/309

OTHER PUBLICATIONS

D.I. Hoult, "Rotating frame zeugmatography", Journal of Magnetic Resonance, 33(1):183-197, 1979.

D. Canet, "Radiofrequency field gradient experiments", Progress in Nuclear Magnetic Resonance Spectroscopy, 30:101-135, 1997.

Casanova et al., "Echo-planar rotating-frame imaging", Journal of Magnetic Resonance Spectroscopy, 162: 396-401, 2003.

Kartaeusch et al., "Spatial phase encoding using a Bloch-Siegert shift gradient", In Proceedings 21st Scientific Meeting, International Society for Magnetic Resonance in Medicine, Salt Lake City, p. 371, 2013.

Katscher et al., "RF encoding using a multielement parallel transmit system", Magnetic Resonance in Medicine, 63(6):1463-1470, 2010.

Sharp et al., "High resolution 2D imaging without gradients with accelerated TRASE", In Proceedings 16th Scientific Meeting, International Society for Magnetic Resonance in Medicine, Toronto, p. 829, 2008.

Sharp et al., "MRI using radiofrequency magnetic field phase gradients", Magnetic Resonance in Medicine, 63(1):151-161, 2010.

Karczmar et al., "Shaped pulses for slice selection in the rotating frame—a study using computer simulations", Journal of Magnetic Resonance, 76:41-53, 1987.

Hedges et al. "The techniques of rotating frame selective excitation and some experimental results", Journal of Magnetic Resonance, 79:391-403, 1988.

Grissom et al., "B1+-selective RF pulses and their design using a rotated Shinnar Le Roux algorithm", In Proceedings 21st Scientific Meeting, International Society for Magnetic Resonance in Medicine, Salt Lake City, p. 2399, 2013.

* cited by examiner

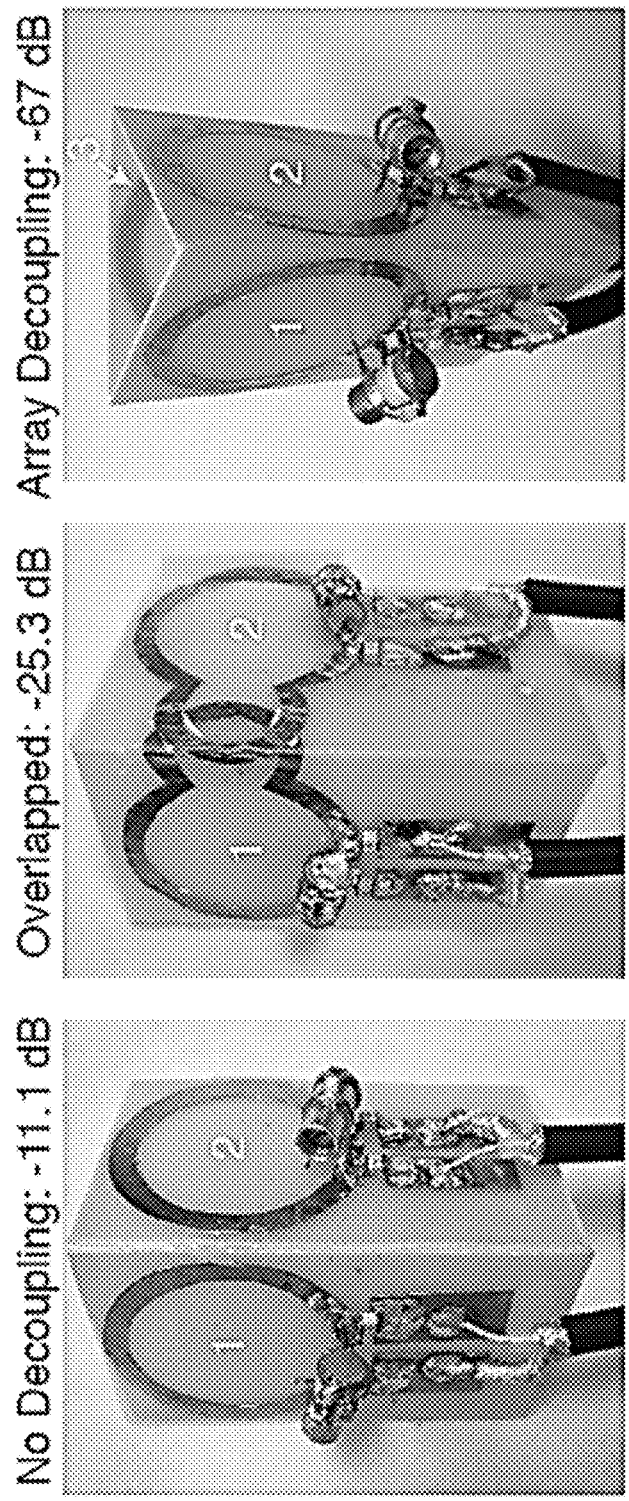

MRI USING RF GRADIENTS FOR SPATIAL ENCODING

CROSS-REFERENCE TO RELATED APPLICATIONS

This application claims priority to and the benefit of U.S. Provisional Patent Application No. 61/950,433, entitled "MRI USING RF GRADIENTS FOR SPATIAL ENCODING and filed Mar. 10, 2014, the contents of which are herein incorporated by reference in their entirety.

FIELD OF THE INVENTION

The present invention relates to magnetic resonance imaging (MRI), and more specifically to apparatus and methods for performing MRI using radio frequency (RF) gradients for spatial encoding.

BACKGROUND

Conventional MRI techniques use linear $B_0$ gradients for spatial encoding. However, $B_0$ gradients have high cost and bulk, and lead to patient discomfort via acoustic noise and peripheral nerve stimulation. A few spatial encoding methods have been proposed that use only RF gradient coils, which would not suffer the drawbacks of B0 gradients. However, existing RF gradient encoding methods severely restrict the types of sequences and subsequently image contrast that can be obtained. What is needed is an RF encoding method that leads to the same orthogonality between spatial encoding and image contrast that is enjoyed by conventional B0 gradients.

SUMMARY

Embodiments of the invention concern systems and methods for performing MRI using RF gradients for spatial encoding. One aspect of the invention involves providing $|B_1^+|$-selective pulses designed using the Shinnar-Le Roux algorithm. Another aspect of the invention involves RF encoding based on the Bloch-Siegert (BS) shift. Together, these techniques can be used to support MRI based on RF gradient encoding instead of the conventional $B_0$ encoding.

BRIEF DESCRIPTION OF THE DRAWINGS

FIGS. 19A. 19B, and 19C illustrate exemplary decoupling strategies for simultaneous RF transmission and reception in accordance with the various embodiments;

DETAILED DESCRIPTION

Figure 1:
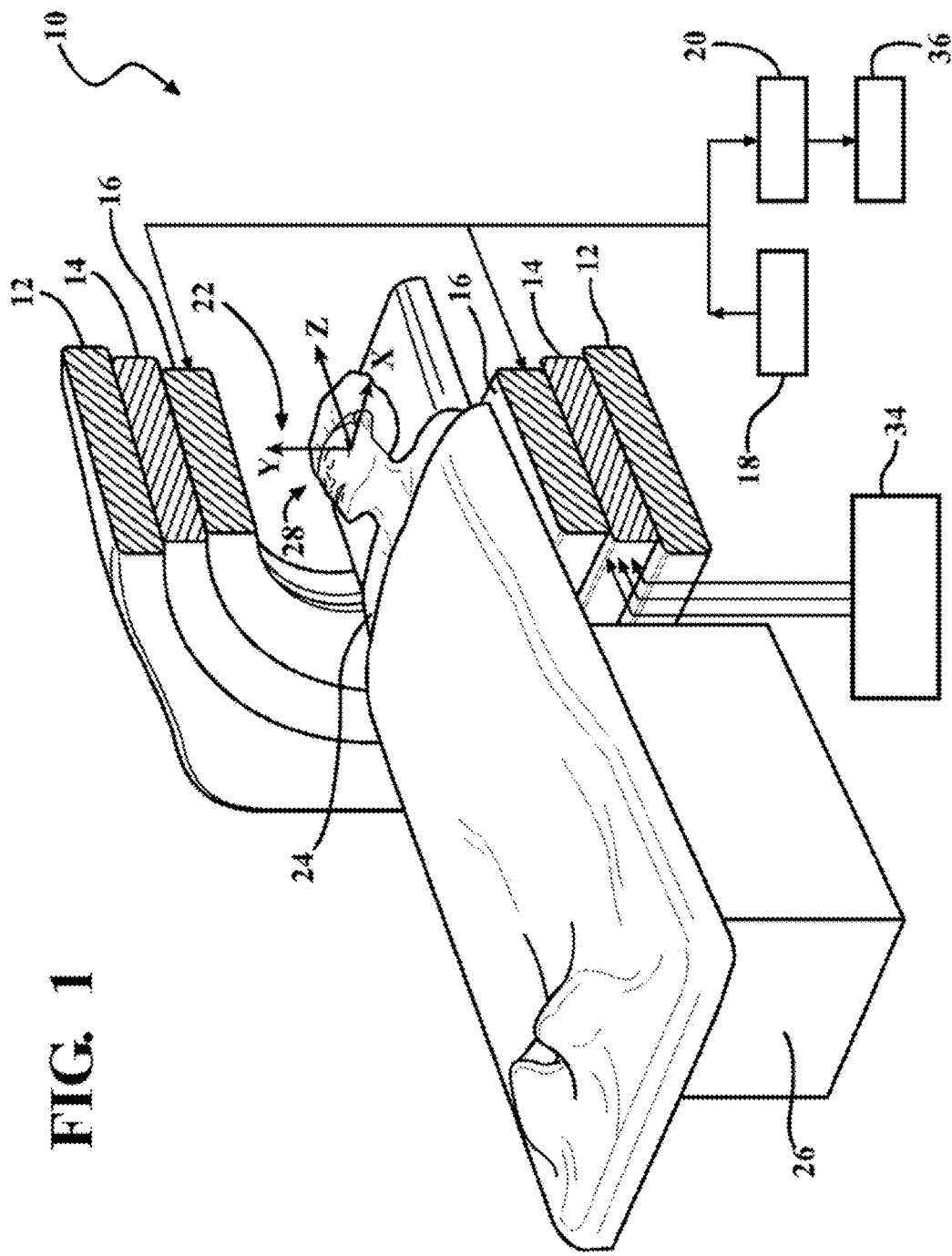
FIG. 1 is a perspective view of an MRI system, partially in cross-section, for implementing a method of acquiring image data from an object.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As noted above, conventional MRI using $B_0$ gradient has various disadvantages that could be overcome via MRI techniques using RF field gradient encoding methods. Such techniques could involve providing an MRI scanner system capable of supporting not only RF field gradients for spatial encoding, but also $B_1$ selective pulses to provide the proper excitation pulse when providing RF field gradient encoding.

Referring to the Figures, wherein like numerals indicate corresponding parts throughout the several views, an MRI system suitable for carrying out the various embodiments of the invention is generally shown at 10 in FIG. 1. The MRI system 10 generally includes a field magnet 12, a set of gradient coils 14, an RF coil 16, an RF transmitter 18, and an RF receiver 20. The field magnet 12 has a coaxial cylindrical configuration and defines a bore 22 therein. An object 24, typically a human body, is disposed on a support 26 which is moveable within the bore 22. The gradient coils 14 and the RF coil 16 are disposed within the bore 22 of the field magnet 12.

Figure 2:
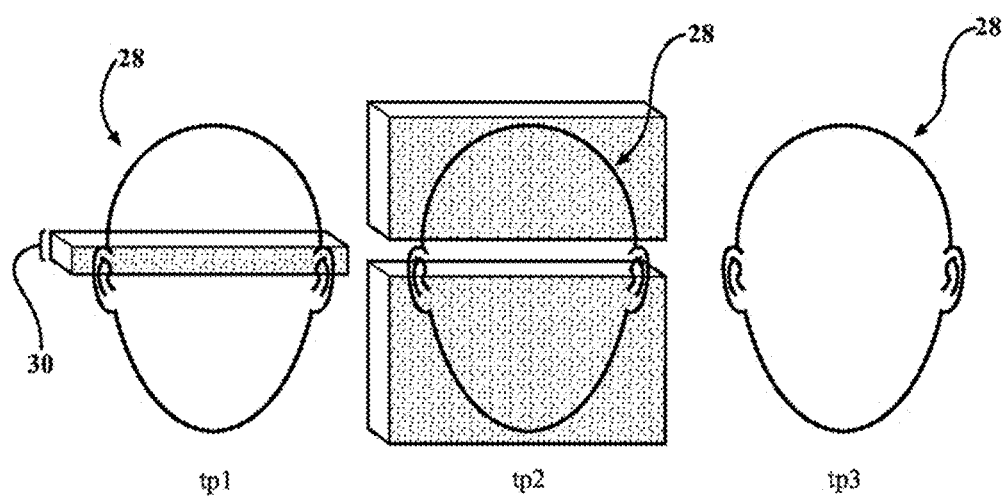
FIG. 2 is an illustrative imaging example of transverse magnetization patterns according to various time-points for a region of interest within a human head.

The MRI system 10 conventionally images a region of interest (ROI) 28 of the object 24. For simplicity, the ROI 28 is shown as a human head in FIGS. 1 and 2. The ROI 28 is imaged according to a plurality of slabs or slices 30. Only one of the plurality of slices 30 is illustrated in FIG. 2 for simplicity. Each slice 30 is generally a planar region having any suitable thickness, such as 10 mm. The MRI system 10 combines the slices 30 to construct an image of the ROI 28. The MRI system 10 may combine the slices 30 to construct a 2D image or a 3D image of the ROI 28 without departing from the scope of the present invention.

The object 24 typically imaged by the MRI system 10 includes a plurality of atomic nuclei within organic matter such as tissue, bones, etc. However, the various embodiments are not limited in this regard. In some embodiments, the systems and methods described herein are can be utilized for imaging applications in various fields, including food science and production, manufacturing industries, and petroleum, natural gas, or other energy industries, to name a few.

Figure 3:
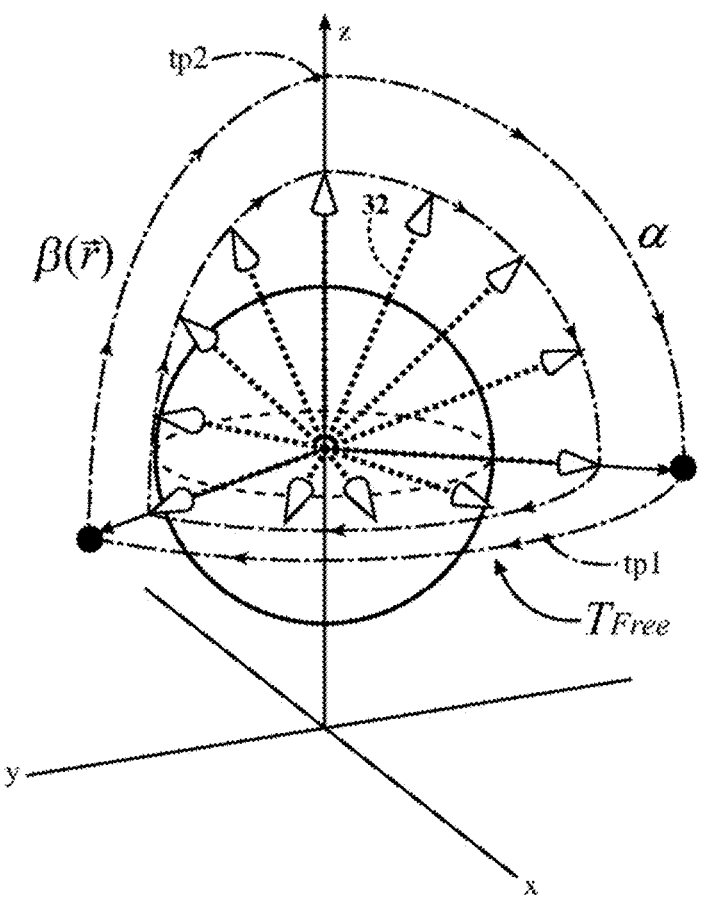
FIG. 3 is an illustration of a steady-state spin path for a single in-slice spin shown along a longitudinal axis (z) and a transverse plane (x, y)
Figure 4:
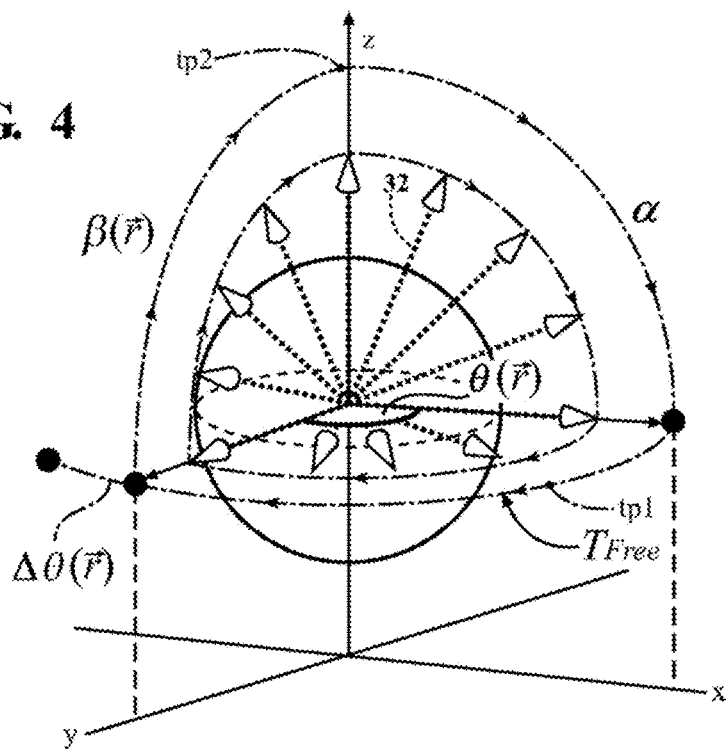
FIG. 4 is an illustration of the steady-state spin path for the in-slice spin shown specifically along the longitudinal axis (z) and a first transverse axis (x) and a second transverse axis (y) of the transverse plane (x, y)

In FIGS. 3 and 4, one atomic nucleus is shown as a sphere for exemplary purposes. Each of the atomic nuclei exhibits an intrinsic angular momentum such that each of the atomic nuclei spins about an axis. The axis represents a magnetic moment of the atomic nucleus. The magnetic moment of each of the atomic nuclei is hereinafter referred to as a spin. The spins are capable of moving within a frame of reference defined generally by the sphere.

Figure 5:
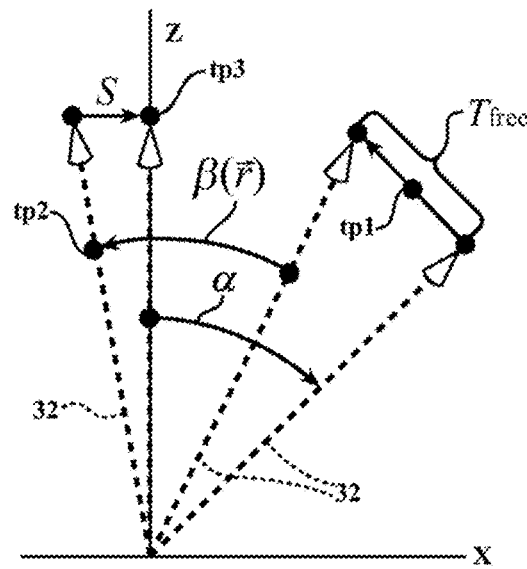
FIG. 5 is a 2D representation of the steady-state spin path of one of the in-slice spins shown along the first transverse axis (x) and the longitudinal axis (z), in the case of θ({right arrow over (r)})=0.
Figure 6:
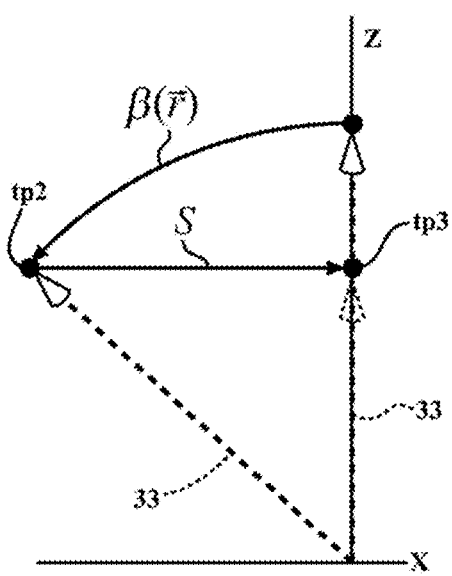
FIG. 6 is a 2D representation of the steady-state spin path of one of the out-of-slice spins shown along the first transverse axis (x) and the longitudinal axis (z), in the case of θ({right arrow over (r)})=0.

The ROI 28 includes a plurality of in-slice spins 32 within each respective slice 30 being imaged. The in-slice spins 32 release a nuclear magnetic resonance (NMR) signal for enabling acquisition of image data, as will be described below. The ROI 28 further includes a plurality of out-of-slice spins 33 outside each respective slice 30 being imaged within the ROI 28. For simplicity, a single in-slice spin 32 is shown in FIGS. 3, 4, and 5. Similarly, a single out-of-slice spin 33 is shown in FIG. 6. Each of the in-slice spins 32 and out-of-slice spins 33 include a single axis, however, to illustrate movement of the spins 32, 33, a plurality of axes are shown along a path of movement in FIGS. 3,4,5, and 6.

As will be described below, the various components of the MRI system 10 manipulate the spins 32, 33 in order to generate the image.

The field magnet 12 can be used to produce a substantially homogeneous magnetic field through the bore 22 in which the object 24 is placed. The homogeneous magnetic field is hereinafter referred to as a $B_0$ field. As shown in FIG. 1, the $B_0$ field defines a longitudinal axis (z) which corresponds to an axis of the bore 22. In FIG. 1, the longitudinal axis (z) passes between the head of the object 24 and the feet of the object 24. The $B_0$ field further defines a transverse plane (x, y) perpendicular to the longitudinal axis (z). The transverse plane (x, y) is defined by a first transverse axis (x) and a second transverse axis (y). In FIG. 1, the first transverse axis (x) passes horizontally through the object 24 and the second transverse axis (y) passes vertically through the object 24. In practice, the $B_0$ field may not be perfectly homogenous and may vary in homogeneity along the object 24.

As will be described below, the ROI 28 of the object 24 is subjected to the $B_0$ field. In turn, the in-slice spins 32 and out-of-slice spins 33 within the ROI 28 align with the longitudinal axis (z) of the $B_0$ field. Transverse magnetization is generated as the spins 32, 33 rotate toward the transverse plane (x, y). The MRI system 10 is configured to detect the transverse magnetization and create image data based on the detected transverse magnetization.

The gradient coils 14 are typically driven by a gradient controller 34. As the gradient coils 14 are driven, the gradient coils 14 produce respective magnetic field gradients Gx, Gy, Gz for spatially encoding positions of the spins 32, 33. Magnetic field gradients Gx, Gy, Gz are generated along the first transverse axis (x), the second transverse axis (y), and the longitudinal axis (z), respectively. The gradient coils 14 apply the magnetic field gradients Gx, Gy, Gz to vary the B0 field linearly across the ROI 28 under imaging. The gradient coils 14 selectively superimpose the magnetic field gradients Gx, Gy, Gz on the B0 field to enable selective spatial excitation of the ROI 28. Spatial excitation may include slice-selective excitation. The gradient coils 14 also enable tailored excitations. However, in certain embodiments, one or more of these gradient fields can be omitted. For example, such as in a fully RF-encoded MRI system.

The MRI system 10 employs the RF coil 16 and the RF transmitter 18 to produce a sequence of RF pulses which are applied to the ROI 28. The sequence of RF pulses is applied to the spins 32, 33 generally to excite and temporarily manipulate the spins 32, 33. The MRI system 10 may employ any suitable method for producing the sequence of RF pulses, including but not limited to, methods employing a single channel or multi-channel transmission array.

The MRI system 10 includes the RF receiver 20 for receiving the NMR signal released by the in-slice spins 32. The MRI system 10 includes a processor 36 to process the NMR signals to form part of the image corresponding to the ROI 28 of the object 24. The MRI system 10 repeatedly applies the sequence of RF field gradients and selective excitation pulses along several slices 30 of the ROI 28 to construct the entire image of the ROI 28. The processor 36 is connected to a display to provide the image of the ROI 28 on the display.

The above-mentioned system describes a system for conventional MRI. However, as noted above, the various embodiments are directed to systems utilizing RF gradients instead of conventional $B_0$ gradients. Accordingly, the system described above can be modified as follows to provide the imaging in accordance with the various embodiments. In particular, at least one of the conventional $B_0$ gradient coils can be replaced with an RF frequency-encoding gradient coil (or a set of RF coils driven simultaneously in such a manner so as to produce a desired RF gradient encoding field). Such an RF frequency-encoding gradient coil can be then used, as described in further detail below, to encode signal spatial position. That coil need not necessarily produce a linearly-varying amplitude field. Additionally, the system described above can be further modified to include additional switching and filtering hardware to enable simultaneous RF transmission and reception. That is, RF coils in such as system could be used for both spatial encoding, excitation and reception, and their roles may change within a single scan. Finally, the RF gradient-encoding coils need not be built into the bore like B0 gradients, but could be integrated into a single smaller package that wraps directly around only the anatomy of interest.

The MRI system 10 in FIG. 1 is intended to be a simplified and exemplary illustration of an MRI in accordance with the various embodiments. As such, the MRI system 10 may include other components not specifically shown in FIG. 1. Furthermore, it is to be appreciated that other MRI systems 10 may be capable of implementing the present invention. Accordingly, the various embodiments of the invention are not limited to the illustrated system and can be implemented for any other type of MRI system such as, but not limited to, open or closed MRI systems, lie-down, standing, or sitting pose MRI systems, and any variants thereof.

RF Spatial Encoding

The use of RF gradient encoding over linear $B_0$ gradients is preferable to avoid the high cost and bulk and potential patient discomfort, via acoustic noise and peripheral nerve stimulation. However, conventional RF gradient encoding methods severely restrict the types of sequences and subsequently image contrast that can be obtained. Accordingly, the various embodiments of the invention provide an RF encoding method that leads to the same orthogonality between spatial encoding and image contrast that is enjoyed by conventional $B_0$ gradients.

Some studies have explored performing to perform RF encoding using the Bloch-Siegert (BS) shift. However conventional means for RF encoding using the BS shift have addressed only BS phase encoding, wherein an off-resonant pulse with a fixed off-resonance frequency is used to generate a phase shift prior to signal acquisition. However, this limits acquisition to a single projection of the data per repetition time (TR). In contrast, the various embodiments of the invention provide a BS shift can be used for frequency encoding, wherein an off-resonant pulse is played out simultaneously with signal acquisition, to enable faster scanning via simultaneous k-space traversal and signal acquisition. That is, to enable acquisition of multiple data projections consecutively in a single TR period.

Figure 7A:
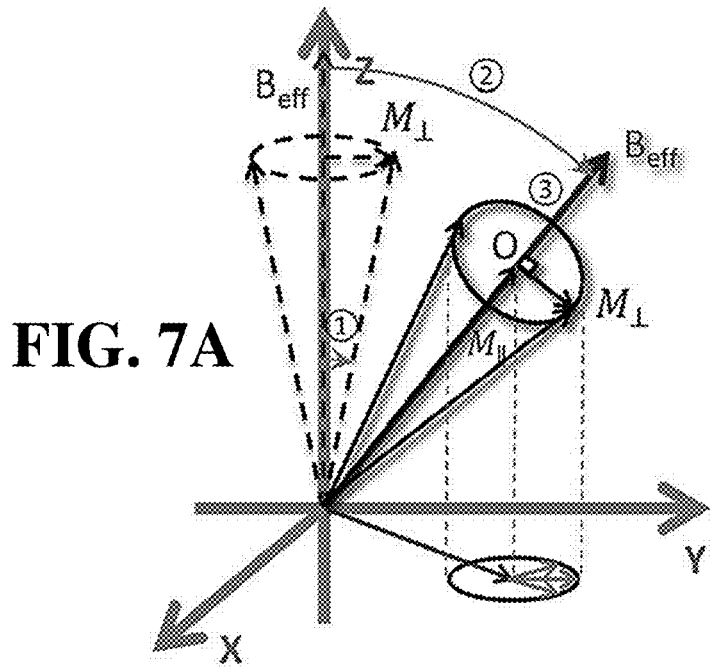
FIG. 7A is a vector depiction of BS frequency encoding in accordance with the various embodiments.
Figure 7B:
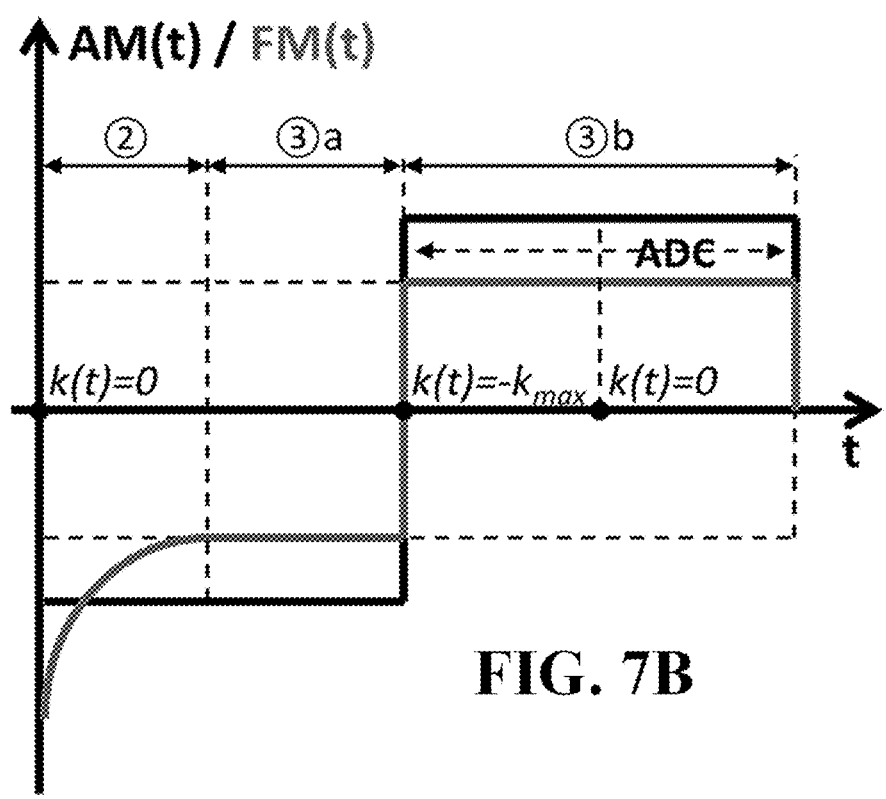
FIG. 7B is a pulse sequence depiction of AM and FM RF waveforms for BS frequency encoding in accordance with the various embodiments.

RF Encoding Sequence. A sequence for RF frequency encoding based on the BS shift, in accordance with the various embodiments, is described with respect to FIGS. 7 and 8. The BS frequency encoding sequence of the various embodiments comprises three major intervals, illustrated in FIGS. 7 and 8, as "(1)", "(2)", and "(3)". FIG. 7A is vector depiction of BS frequency encoding in accordance with the various embodiments. FIG. 7B is a pulse sequence depiction of AM and FM RF waveforms for BS frequency encoding in accordance with the various embodiments.

First, at interval (1) of FIG. 7A, a longitudinal magnetization is excited to produce a transverse magnetization $M_\perp$, i.e., a magnetization substantially along the Z-axis or substantially perpendicular to the transverse plane (X-Y plane). This produces a cone of excited magnetization due to natural procession, as shown in FIG. 7. Next at interval (2), an adiabatic sweep (as illustrated in FIG. 2 at interval (2)) is applied using an RF gradient coil. This causes the cone of excited magnetization to be rotated away from the Z-axis and towards the transverse plane, as shown in FIG. 1 for interval (2). It should be noted that although FIG. 7 shows a significant rotation with respect to the Z-axis, any amount of rotation may occur. Thus, the cone may be rotated only one degree or less in some cases. Finally, at interval (3), the rotated cone is is kept locked during simultaneous data acquisition at Larmor frequency $\omega_0$ and RF frequency encoding at frequency $\omega_0+\omega_{RF}$.

As noted above, FIG. 7B illustrates the pulse sequence for AM and FM RF waveforms and interval (2) shows an adiabatic sweep to cause the rotation. Interval (3), during which data acquisition occurs can consist of two portions: (3)a and (3)b. Interval (3)a is an optional pre-phasing process that enables symmetric acquisition of spatial frequencies (k(t)), and interval 3(b) is the signal acquisition interval, during which traversal of spatial frequency space k(t) and signal reception occur simultaneously. This efficient process of signal acquisition is a defining feature of the present invention and is not possible by previous RF encoding methods.

Figure 8A:
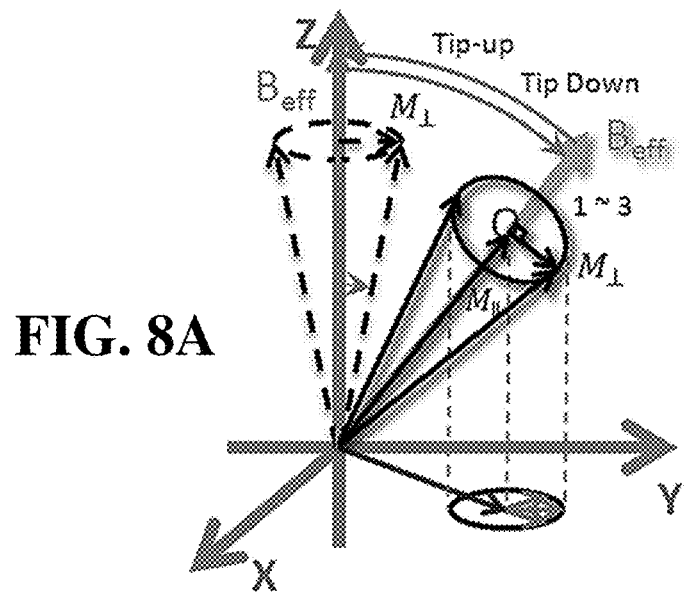
FIG. 8A is a vector depiction of BS frequency encoding in accordance with the various embodiments.
Figure 8B:
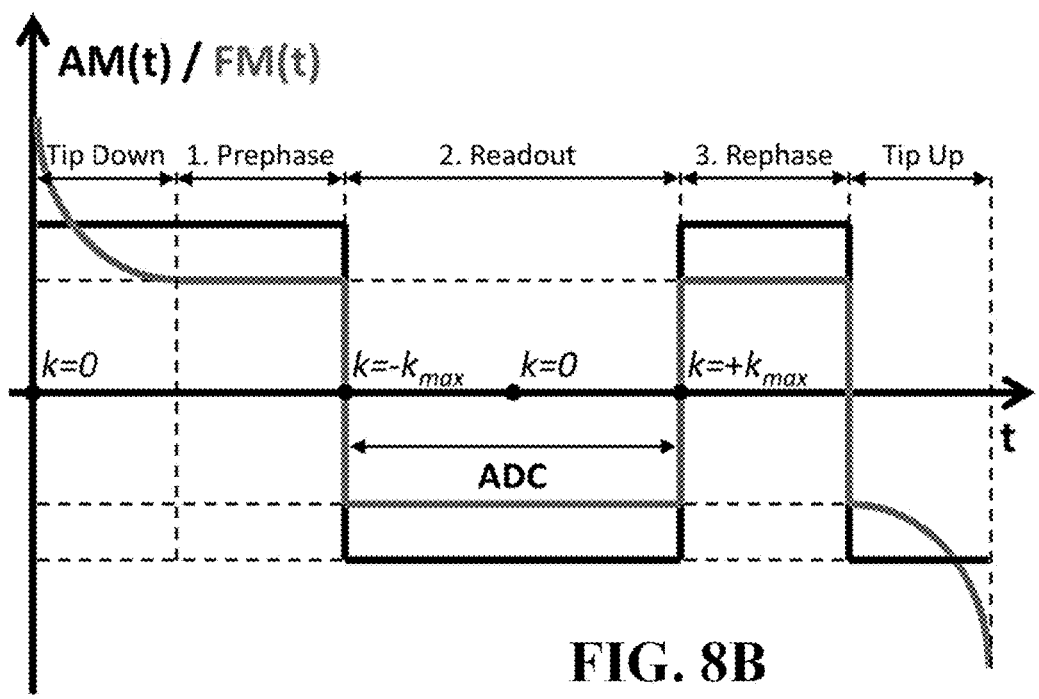
FIG. 8B is a pulse sequence depiction of AM and FM RF waveforms for BS frequency encoding in accordance with the various embodiments.

FIGS. 8A and 8B illustrate a similar process with tip-down and tip-up modules at each end. FIG. 8A is vector depiction of BS frequency encoding, with tip-down and tip-up modules at each end, in accordance with the various embodiments. FIG. 8B is a pulse sequence depiction of AM and FM RF waveforms for BS frequency encoding, with tip-down and tip-up modules at each end, in accordance with the various embodiments. In this process, a tip-down is first performed. Thereafter the frequency-encoding gradient sequence should (1) perform a pre-phase to move to one edge of k-space ($-k_{max}$). Next, (2) a readout signal is obtained while traversing k-space to the k-space center (k=0) and further to the other edge of k-space ($+k_{max}$). Thereafter, (3) re-phases the signal, cancelling all previous phase accrual, to k=0 (for uniform steady-state). Finally, tip-up is performed.

Signal Equation for RF Encoding Sequence. A signal expression can be derived based on trigonometric relationships. The locked magnetization $M_\perp$ traces an elliptical path in the transverse XY plane. The detectable MR signal of each voxel at Larmor frequency $\omega_0$ can be derived as:

$$S(t) \propto \exp(i\omega_{RF}t)\int dx\{|M_\perp(x)|(\cos(\phi_{init}(x)-\phi(x,t))+i\sin(\phi_{init}(x)-\phi(x,t))\cos(\Psi(x)))\} \quad (1)$$

Here, $\varphi_{init}$ is the initial phase of $M_\perp$ before the encoding, and $\Psi$ is the angle between the plane perpendicular to $B_{eff}$ and the X-Y plane during interval (3)b, and $$\phi(x,t) = 2\pi k(t)\cdot x = \frac{\gamma}{2\pi}\int_0^t di\frac{\partial B_{eff}(x,i)}{\partial x}\cdot x, \quad (2)$$

$$B_{eff}(x,i) = \sqrt{|B_1^+(x,i)|^2 + \left(\frac{\omega_{RF}(t)}{\gamma}\right)^2}. \quad (3)$$

It should be noted that with conventional $B_0$ gradient encoding, $$\omega_{RF}=0 \quad (4)$$

$$\cos(\Psi)=1 \quad (5)$$

$$\phi(x,t)=2\pi k(t)\cdot x=\gamma\int_0^t dt G(x,i)\cdot x) \quad (6)$$

Image Reconstruction. Because the signal precesses elliptically due to the cos(Ψ) term, the detected signal has a non-linear dependence on the complex transverse magnetization $M_\perp$. Thus image reconstruction must comprise a fit of $|M_\perp|$, and $\varphi_{init}$ at each spatial location to the nonlinear signal model.

Acquired Resolution. Assuming a linear RF field gradient $B_1(x)=cx$, for a given desired spatial resolution $\Delta x$ and $\omega_{RF}$, the required total sampling duration T is dictated by the spatial location in the object with the lowest $|B_1^+|$ amplitude, according to:

$$T = \frac{\omega_{RF}}{\gamma^2 c^2 \Delta x}. \tag{7}$$

Excitation for RF Gradient Encoding Methods

As noted above, the RF gradient encoding methods of the various embodiments need to be used with the proper type of excitation pulse to provide imaging. In particular, the various embodiments of the invention can rely on the use of $B_1^+$-selective RF pulses.

In 1980 Hoult described 'Rotating Frame Selective Excitation Pulses' that selectively excite magnetization based on the strength of the RF transmit field ($|B_1^+|$) they experience. The pulses were intended for use in rotating frame imaging, but could be used for slice selection in any of several RF gradient-based imaging methods that have been proposed since. The pulses were based on the assumption of a large and constant $B_{1,x}$ gradient field. When this field was switched on, initially-longitudinal magnetization would precess around it in the y-z plane. Hoult showed that by modulating the $B_{1,y}$ field, magnetization could be selectively excited based on the magnitude of the $B_{1,x}$ component (the strength of $B_{1,y}$ was implicitly assumed to be constant across space). The pulses were designed by analogy to $B_0$-selective excitation, wherein $B_{1,x}$ was treated as the longitudinal gradient field, and $B_{1,y}$ the perpendicular field responsible for flipping magnetization. Assuming a constant $B_{1,x}$ waveform was played (analogous to the constant $B_0$ gradient used in conventional slice-selective excitation), pulse design then amounted to designing the $B_{1,y}$ modulation required to obtain the desired slice profile. Somewhat improved design methods and results were described several years later. To date however, no clear algorithm has been reported to design the pulses to meet target slice profile characteristics, in analogy to the Shinnar-Le Roux algorithm which is widely used for conventional slice-selective pulse design.

In the various embodiments, the $|B_1^+|$-selective pulse design problem was recast as one of designing a frequency modulation waveform rather than a $B_{1,y}$ field component, and show that the small-tip-angle Shinnar-Le Roux (SLR) algorithm can be used to directly design this waveform for excitations (0-90° tip angles) and inversions. The result is a simple and fast pulse design approach that inherits the ease-of-use of SLR, provides a substantial improvement in the selectivity of the pulses over previous design methods, and enables the excitation of larger tip-angles. Therefore, algorithm of the various embodiments extends the attractive properties of the Shinnar-Le Roux algorithm to the design of $|B_1^+|$-selective pulses. These include speed and the ability to predict slice profile characteristics analytically, and to thereby make tradeoffs between pulse parameters before ever designing a pulse and evaluating it. Thus, this eliminates the need for a guess-and-check approach to pulse design and makes the design process more accessible to non-experts.

Further, previous methods for $|B_1^+|$-selective pulse design focused on the design of the y-component of the RF field, and assumed that the amplitude of the overall field was independent of that component. In contrast, by directly designing the frequency modulation waveform rather than the y-component of the RF field, the algorithm described herein eliminates a source of approximation error in the pulse design that may have hampered previous methods.

RF Waveform Definitions

Figure 9:
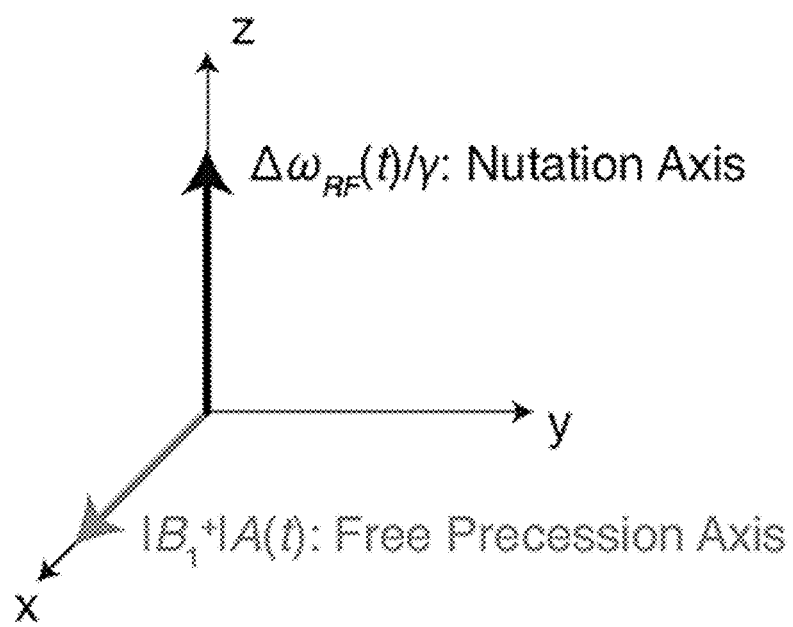
FIG. 9 is an illustration of field and axis configuration for $|B_1^+|$-selective pulse design by SLR.

The algorithm of the various embodiments directly designs an RF frequency modulation waveform $\Delta \omega_{RF}(t)$ that is paired with an amplitude and sign modulation waveform $A(t)$ to comprise a $|B_1^+|$-selective excitation pulse. Given these waveforms, the pulse can be expressed in terms of its x and y components as:

$$\vec{B}_1(t) = |B_1^+|A(t)(\hat{x}\cos(\phi(t) + \angle B_1^+) + \hat{y}\sin(\phi(t) + \angle B_1^+)), \tag{8}$$

where $$\varphi(t) = \int_0^t \Delta \omega_{RF}(t')dt' \cdot A(t)$$

will be real-valued, with a maximum amplitude of one, and without loss of generality we will assume $\angle B_1^+=0$. In a frame rotating at $\omega_0 + \Delta \omega_{RF}(t)$, where $\omega_0$ is the Larmor frequency, the pulse comprises two vector components that are illustrated in FIG. 9: a transverse component with length $|B_1^+|A(t)$, and a z-directed component with length $\Delta \omega_{RF}(t)/\gamma$, where $\gamma$ is the gyromagnetic ratio. The proposed algorithm operates in this frame.

FIG. 9 is an illustration of field and axis configuration for $|B_1^+|$-selective pulse design by SLR. The pulse is expressed in terms of its amplitude and sign modulation waveform $A(t)$ and its frequency modulation waveform $\Delta \omega_{RF}(t)$. Here these components are depicted in the frame rotating at frequency $\omega_0 + \Delta \omega_{RF}(t)$. Whereas conventionally the SLR algorithm designs the x and y components of an RF waveform, in $|B_1^+|$-selective pulse design it is modified to design the z-directed frequency modulation waveform $\Delta \omega_{RF}(t)$, by rotating the definitions of the pulse's spinor parameters α and β.

Rotated spinor parameters. The SLR algorithm of the various embodiments was developed to design a transverse RF field waveform that is played simultaneously with a constant gradient waveform for slice selection. In $|B_1^+|$-selective pulse design by SLR, $\Delta \omega_{RF}(t)$ takes the place of the transverse RF field waveform, and $A(t)$ takes the place of the gradient waveform for slice selection, and is scaled by $|B_1^+|$ rather than by a spatial coordinate. This configuration is achieved by rotating the definition of the pulse's spinor parameters α and β: whereas conventionally α represents rotations about the z-directed gradient field (the 'free precession' axis) and β represents rotations about the RF field with x and/or y components (the 'nutation' axis), for $|B_1^+|$-selective SLR pulse design α is redefined to represent rotations about the x-axis, and β is redefined to represent rotations about a field with z and/or y components. α will thereby represent rotations about the transverse $|B_1^+|A(t)$ field, and β will represent rotations about the z-directed $\Delta \omega_{RF}(t)/\gamma$ field. Definitions of the magnetization components remain unchanged.

Target excitation profile. The SLR algorithm is based on relating target magnetization profiles ($M_x$, $M_y$, and $M_z$) to spinor parameter profiles ($\alpha$ and $\beta$) whose discrete Fourier transform (DFT) coefficients can be inverted to obtain the RF pulse that produces them. To apply the algorithm to design an $\Delta\omega_{RF}(t)$ waveform that excites a slice along the $|B_1^+|$ axis, we must express target excitation profiles in terms of the rotated $\alpha$ and $\beta$ parameters. The inverse SLR transform can then compute the $\Delta\omega_{RF}(t)$ waveform that corresponds to those parameters. Given initial magnetization $M_{zy}^- \triangleq M_z^- + 1M_y^-$, and $M_x^-$, the magnetization after a pulse with rotated $\alpha$ and $\beta$ parameters will be:

$$\begin{pmatrix} M_{zy}^+ \\ M_{zy}^{+*} \\ M_x^+ \end{pmatrix} = \begin{pmatrix} (\alpha^*)^2 & -\beta^2 & 2\alpha^*\beta \\ -(\beta^*)^2 & \alpha^2 & 2\alpha\beta^* \\ -\alpha^*\beta^* & -\alpha\beta & \alpha\alpha^* - \beta\beta^* \end{pmatrix} \begin{pmatrix} M_{zy}^- \\ M_{zy}^{-*} \\ M_x^- \end{pmatrix}. \quad (9)$$

For initial magnetization at thermal equilibrium (($M_x^-$, $M_y^-$, $M_z^-$)=(0,0,1)), the excited transverse magnetization will be:

$$M_x^+ = -\alpha^*\beta^* - \alpha\beta = -2(\alpha_R\beta_R - \alpha_I\beta_I) \quad (10)$$

$$M_y^+ = \Im\{(\alpha^*)^2 - \beta^2\} = -2(\alpha_R\alpha_I + \beta_R\beta_I), \quad (11)$$

where the R and I subscripts denote the real and imaginary parts of the parameters, respectively. As in conventional linear-phase SLR pulse design and previous $|B_1^+|$-selective design methods, we will design pulses that produce constant—(specifically, zero-) phase profiles across the excited slice so that $M_y^+=0$. For these pulses $\beta_I$ will also be zero. If one further restricts consideration to small-tip-angle pulses with A(t) waveforms that have zero integrated area, then $\alpha_R \approx 1$ and $\alpha_I \approx 0$. In this case, $$M_x^+ = -2\beta_R, \quad (12)$$

and $M_y^+=0$. Therefore, $\beta_R$ is the parameter of interest for digital filter design in the $|B_1^+|$-selective SLR algorithm. Conveniently, because $M_x^+=-2\beta_R$ also for a conventional refocused small-tip-angle slice-selective pulse, the same ripple relationships also apply to $|B_1^+|$-selective pulse design.

Figure 10:
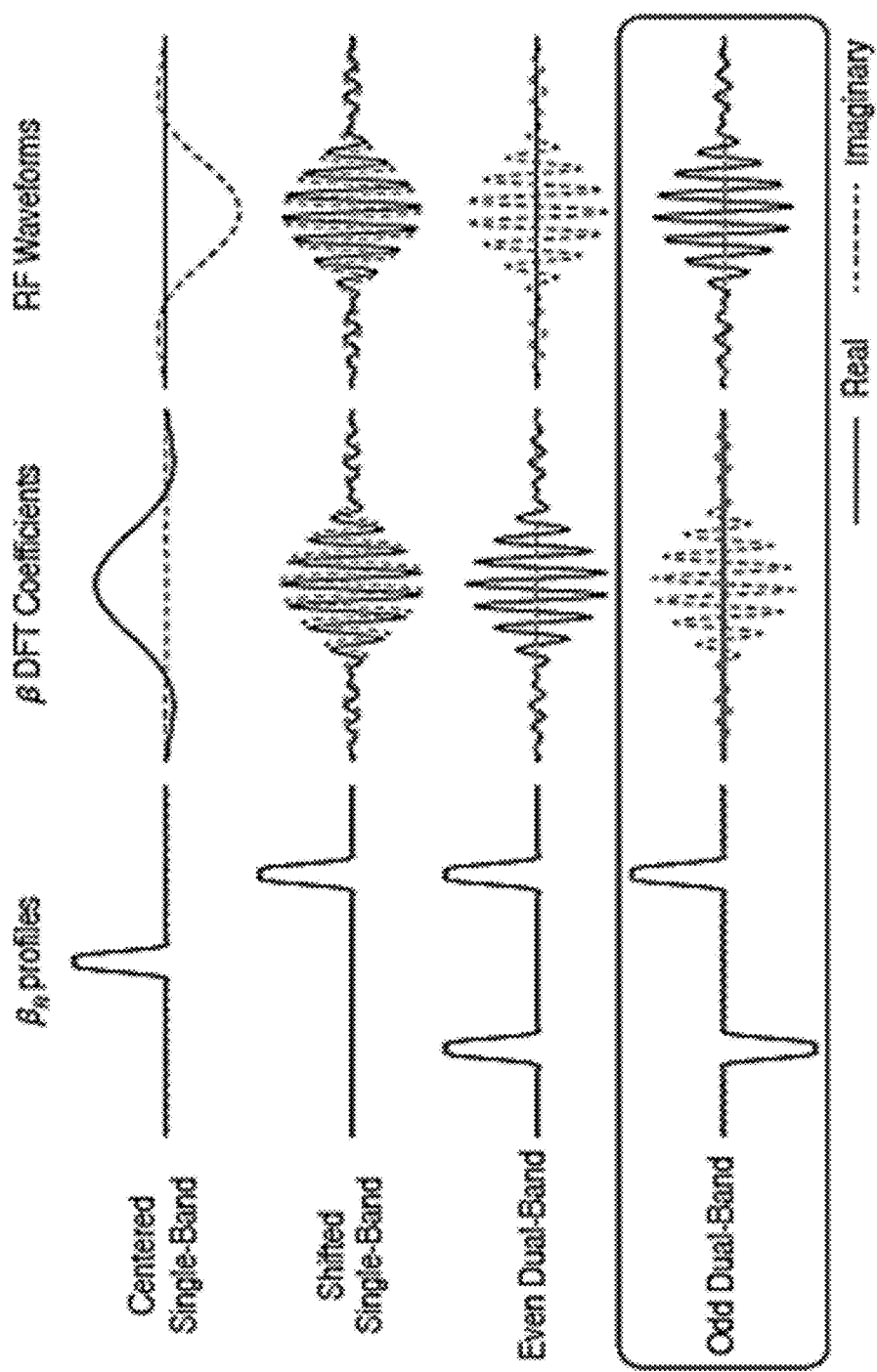
FIG. 10 illustrates target β profile configuration for $|B_1^+|$-selective pulse design in accordance with the various embodiments.

FIG. 10 illustrates target $\beta$ profile configuration for $|B_1^+|$-selective pulse design. (Top row) A conventional single-band slice profile would be centered at the zero position on the selection axis, which is impossible for a $|B_1^+|$-selective pulse since excitation cannot occur with zero RF field. (Second row) Frequency modulation can be applied to shift the slice profile away from $|B_1^+|=0$, but this results in a complex pulse that is not physically realizable since $\Delta\omega_{RF}(t)$ must be real-valued. (Third and fourth rows) A dual-band pulse with symmetric slice shifts corresponds to a purely imaginary (even dual-band) or purely real (odd dual-band) RF pulse; to obtain a purely real $\Delta\omega_{RF}(t)$, an odd dual-band $\beta$ profile is used (box). The $\beta_I$ profile is zero in all cases.

Unlike conventional slice-selective excitation, a $|B_1^+|$-selective slice profile cannot be centered at $|B_1^+|=0$ since excitation cannot occur with zero RF field. Thus, the slice profile must be shifted away from this point. A slice-selective excitation is conventionally shifted using frequency modulation of the RF pulse; however, this would result in complex $\beta$ DFT coefficients, and subsequently a complex-valued $\Delta\omega_{RF}(t)$ waveform. The $\Delta\omega_{RF}(t)$ waveform must be real-valued to be physically realizable, which dictates that the $\beta$ DFT coefficients must be purely imaginary, since a small-tip RF pulse designed by SLR is $\pi/2$ out of phase with its $\beta$ DFT coefficients. The required purely imaginary $\beta$ DFT coefficients can be obtained by specifying an odd and dual-band (anti-symmetric) $\beta$ profile. Thus, the target $\beta$ profile must be real-valued, dual-band, odd, and zero at $|B_1^+|=0$. The corresponding $\Delta\omega_{RF}(t)$ will be real-valued and odd.

$\beta$ filter design. A real-valued, odd, and dual-band $\beta$ profile and its corresponding DFT coefficients can be designed in several ways. For well-separated passbands (i.e., centered at sufficiently high $|B_1^+|$), the process can start with a conventional single-band linear-phase finite impulse response filter designed using a weighted-least squares method. That filter is then duplicated, and the duplicates are frequency modulated to opposite center frequencies and subtracted from each other. This is equivalent to modulation of the single-band filter by a sine function at the center frequency. For very close passbands (i.e., passbands close to $|B_1^+|=0$) however, ripples from one band can distort the other. In these cases, an odd, dual-band $\beta$ filter can be designed directly using weighted-least-squares. The distortions could also be mitigated using a phase-correction method. Once the $\beta$ filter is designed, assuming small excitation angles the inverse SLR transform reduces to a simple scaling of the filter coefficients to obtain the $\Delta\omega_{RF}(t)$ waveform.

A(t) waveform construction. The SLR algorithm conventionally designs an RF pulse that accompanies a constant gradient waveform. In $|B_1^+|$-selective pulse design, A(t) replaces the gradient waveform. In the small-excitation angle regime, the $\alpha$ profile at the end of a pulse with duration T is:

$$\alpha(|B_1^+|) = e^{-\frac{i\gamma}{2}|B_1^+|\int_0^T A(t)dt}, \quad (13)$$

and the $\beta$ profile is:

$$\beta(|B_1^+|) = \frac{i}{2}e^{-\frac{i\gamma}{2}|B_1^+|\int_0^T A(s)ds}\int_0^T \Delta\omega_{RF}(t)e^{-i\gamma|B_1^+|\int_t^T A(s)ds}dt, \quad (14)$$

$$= \frac{i}{2}e^{\frac{i}{2}|B_1^+|k(0)}\int_0^T \Delta\omega_{RF}(t)e^{-i|B_1^+|k(t)}dt, \quad (15)$$

Where $$k(t) \triangleq \gamma \int_t^T A(s)ds$$

is the pulse's $|B_1^+|$-frequency trajectory. From Eq. 14, it is evident that if A(t) is constant and comprises no pre- or rewinder lobes before or after the $\Delta\omega_{RF}(t)$ waveform to achieve zero total area, then $\alpha_I \neq 0$, which is unacceptable. Zero total area could be achieved by adding a negative rewinder lobe to A(t) with the same area as the main lobe, but according to Eq. 15 this would create a nonzero $\beta_I$ since $\Delta\omega_{RF}(t)$ would deposit energy at negative frequencies only, as depicted in the middle column of FIG. 11.

Figure 11:
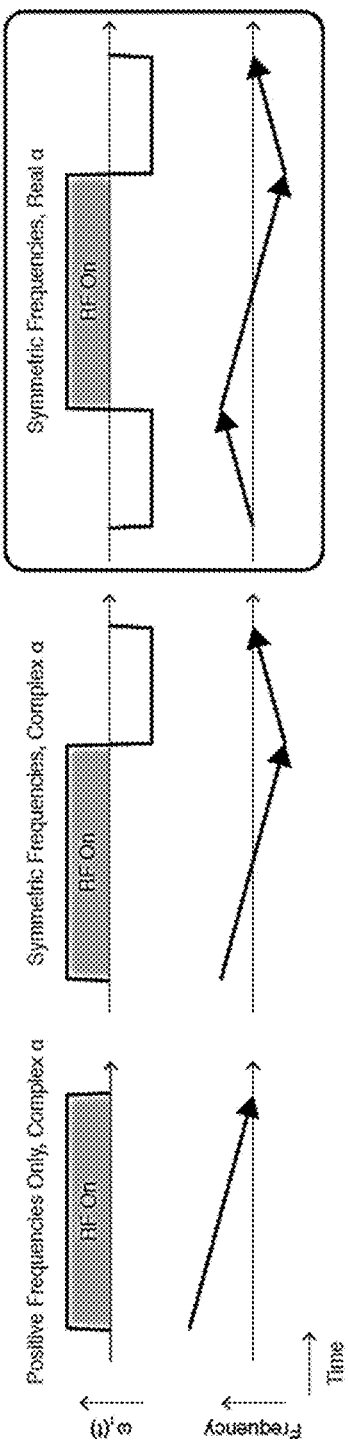
FIG. 11 illustrates amplitude and sign modulation waveform (A(t)) construction.

FIG. 11 illustrates amplitude and sign modulation waveform (A(t)) construction. (Left Column) With no pre- or rewinding, the $|B_1^+|$-frequency trajectory k(t) visits both positive and negative frequencies when $\Delta\omega_{RF}(t)$ is on, enabling $\Delta\omega_{RF}(t)$ to deposit energy anti-symmetrically as required to obtain a purely real $\beta$ profile (Eq. 15). However, the total area under A(t) is non-zero, leading to a complex-valued α profile which is unacceptable (Eq. 13). The middle column illustrated that by adding a rewinder to the waveform, the area under A(t) is zero so α=1 as required, but $\Delta\omega_{RF}(t)$ only deposits energy when k(t) is negative, leading to a complex β profile. The right column illustrates an optional splitting of the rewinder between the beginning and end of the pulse to restores the desired trajectory, and α=1, as required.

A real and odd β profile can only be produced if $\Delta\omega_{RF}(t)$ deposits energy anti-symmetrically as a function of frequency, and therefore cannot be produced with this trajectory. Placing the rewinder lobe at the beginning of the pulse would also lead to nonzero $\beta_I$. Thus, in some embodiments of the invention, the desired symmetric k(t) can be restored by splitting the rewinder lobe, so that half is played at the beginning and half at the end, as shown in the right column of FIG. 11. With this configuration, α=1 and $\beta_I$=0 as required. This A(t) waveform configuration is analogous to a balanced gradient waveform configuration for conventional slice-selective excitation, which is commonly used for refocusing pulses in spin echo sequences and for excitation pulses in balanced steady-state free precession sequences.

Figure 12A:
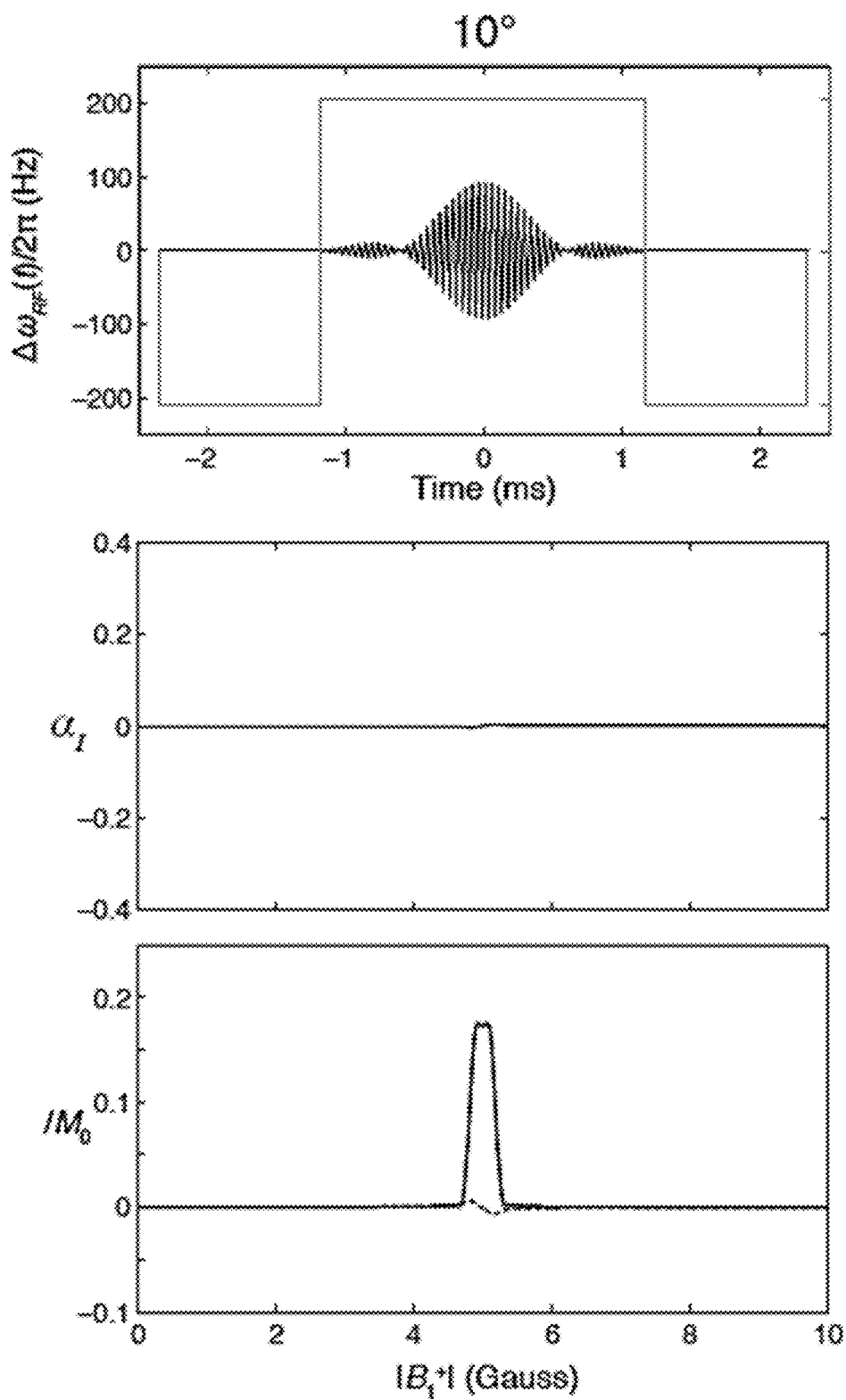
FIGS. 12A, 12B, 12C, 12D, and 12E illustrate maintenance of selectivity at large tip-angles.
Figure 12B:
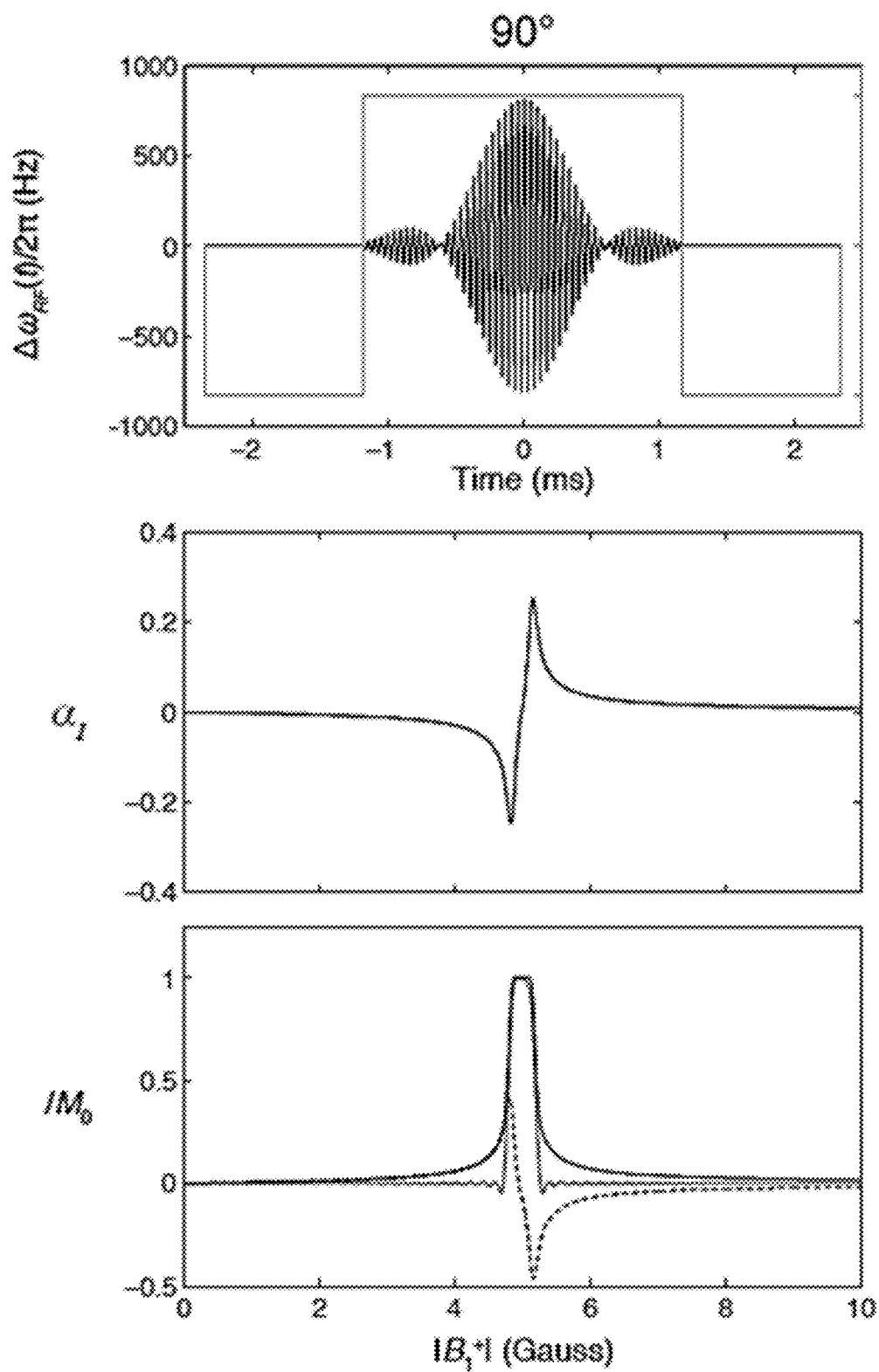
Figure 12C:
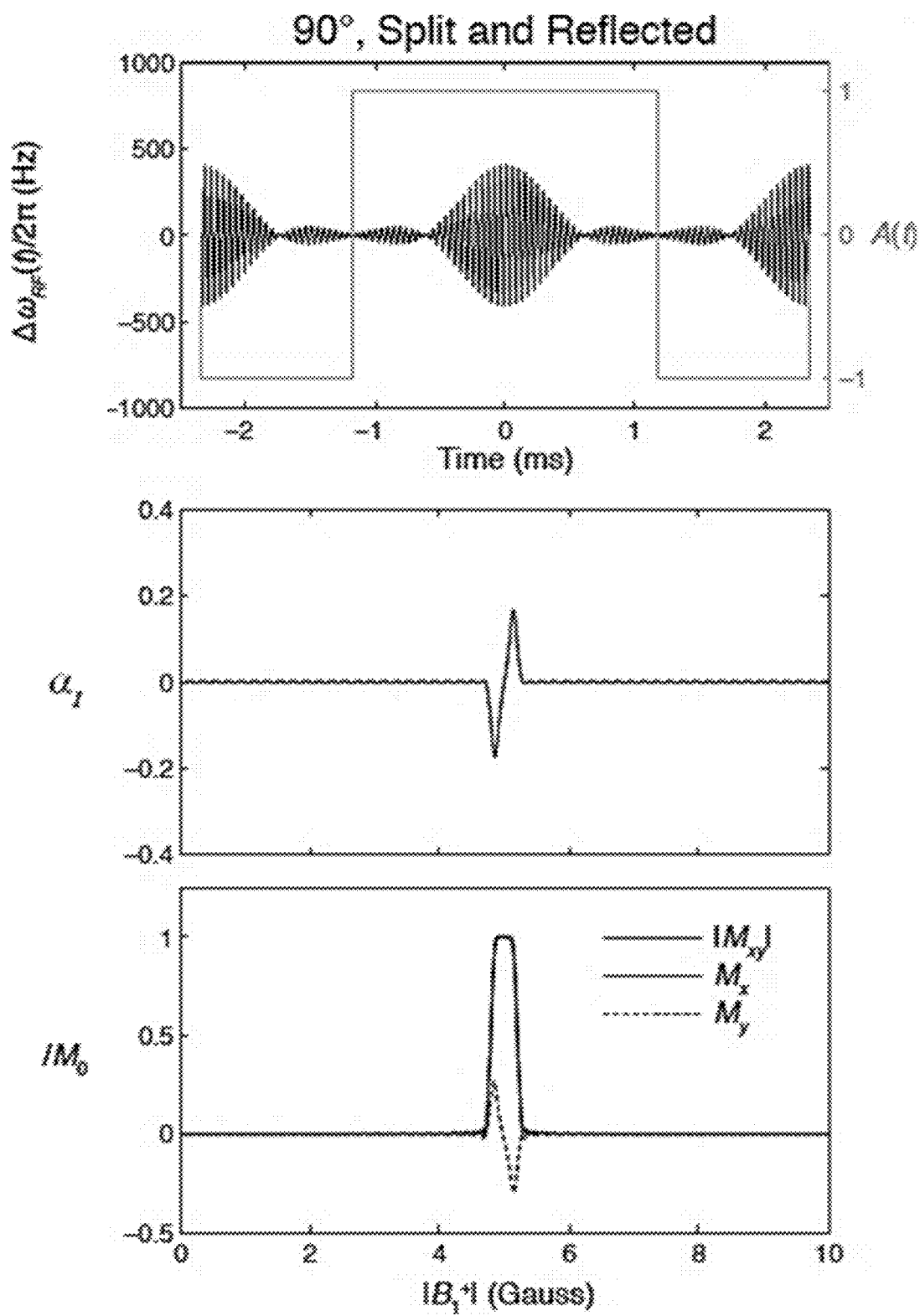
Figure 12D:
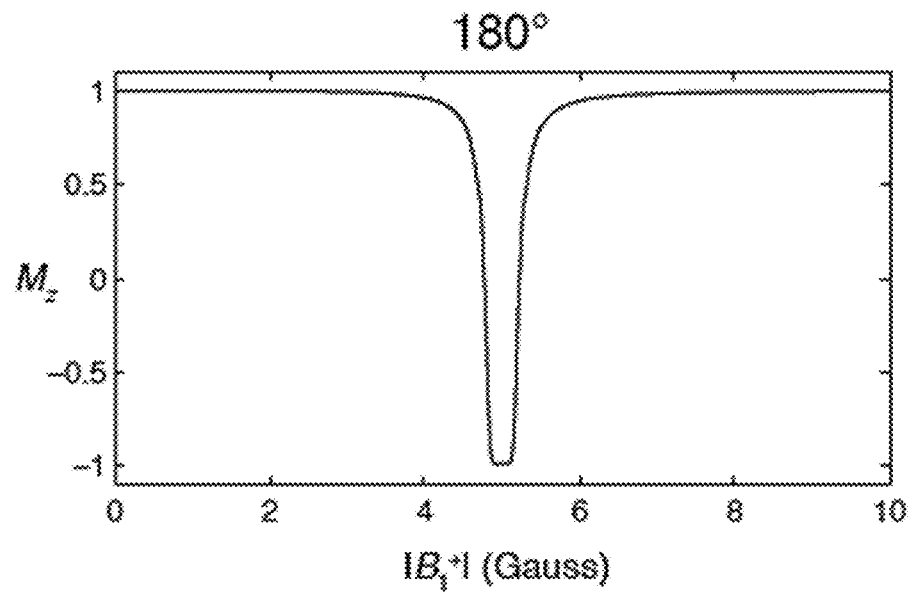
Figure 12E:
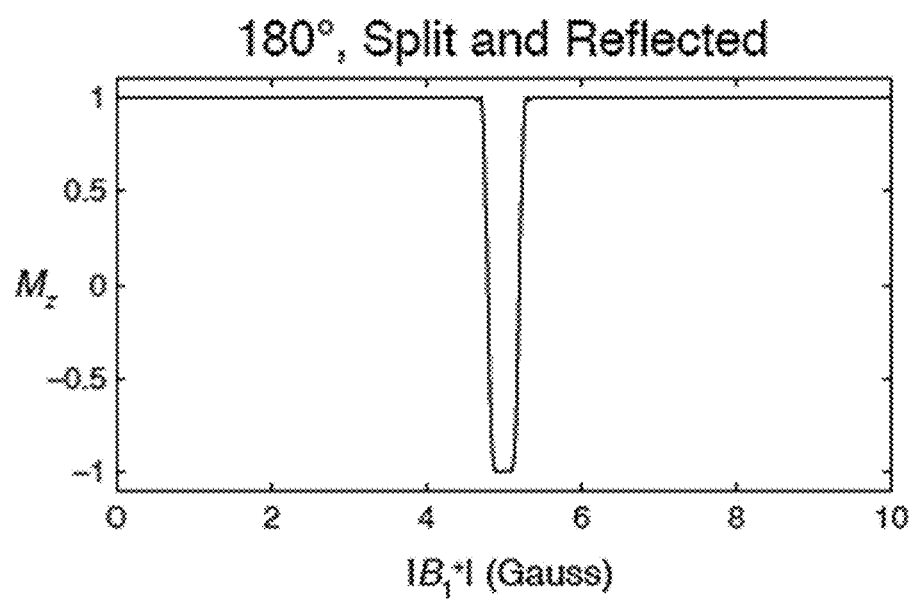

Maintaining selectivity at large tip-angles. FIGS. 12A-12E illustrates maintenance of selectivity at large tip-angles. FIGS. 12A and 12B show that as a $|B_1^+|$-selective pulse is scaled to excite a large tip-angle, $\alpha_I$ grows and degrades the excited profile by creating a large unwanted $M_y$ component (Eq. 11), particularly in the stopband. This is a consequence of the Hilbert transform relationship between the amplitude and phase of α for a minimum-power pulse, and it is impossible to design an α filter that has the magnitude response required by a large-tip SLR pulse and a zero phase response, for any nonzero flip angle. To reduce the unwanted stopband excitation and achieve more accurate large-tip-angle excitations and inversions, the two halves of the $\Delta\omega_{RF}(t)$ waveform can be reflected and played out on the pre- and rewinding A(t) lobes. The amplitude of the whole pulse is also divided by two to achieve the target tip angle. With this modification, the size of the $\alpha_I$ component is reduced dramatically, and selectivity is restored at large tip-angles, as shown in FIG. 12C. This works because, for each half of the pulse, time-reversal flips the phase of α, and the division by two increases its amplitude, which reduces its phase by the Hilbert transform relationship. This leads to a combined α parameter for each half that is dominated by $|\alpha|^2$ when the pulse halves are played back-to-back with their time-reversed copies. FIGS. 12D and 12E show that with this modification, selective inversions can be designed.

Selective Pulse Design Algorithm. Given the RF digital-to-analog conversion dwell time $\Delta_t$ (seconds), the time-bandwidth product TB, the pulse type (small-tip, excitation, inversion, or saturation), the tip angle Θ (radians), the passband width PBW (Gauss), the passband center PBC (Gauss), and the passband ($\delta_{1,e}$) and stopband ($\delta_{2,e}$) ripple levels (units of $M_0^{-1}$), the steps of the $|B_1^+|$-selective pulse design algorithm are:

1. Calculate the half-pulse duration T and the number of samples in the half-pulse n:

$$T = \frac{TB}{\frac{\gamma}{2\pi}PBW} \quad (16)$$

$$n = 2\left\lceil\frac{T}{2\Delta_t}\right\rceil \quad (17)$$

where γ is the gyromagnetic ratio in radians per second per Gauss.

2. Calculate the inputs for finite impulse response (FIR) β filter design. The required inputs to the commonly-used "firls" function in MATLAB, available from Mathworks of Natick, Mass., USA for weighted least-squares FIR filter design are:
The number of samples in the filter:

$$n \quad (18)$$

Normalized band edges:

$$f = \left[0 \; (1-w)\frac{TB}{n} \; (1+w)\frac{TB}{n} \; 1\right] \quad (19)$$

Amplitude of frequency response at band edges:

$$m=[1\;1\;0\;0] \quad (20)$$

Band error weights:

$$wts = \left[1 \; \frac{\delta_1}{\delta_2}\right] \quad (21)$$

Here, w is the fractional transition width, which is:

$$w = \frac{d_\infty(\delta_1, \delta_2)}{TB} \quad (22)$$

where the β ripples ($\delta_1,\delta_2$) are calculated from ($\delta_{1,e}$, $\delta_{2,e}$) and the pulse type using the analytic relationships and $d_\infty$ function defined in. We note that there are other options for linear-phase FIR filter design that could be used in place of the firls function, such as the Parks-McClellan algorithm.

3. Run the FIR filter design tool to design the β filter, producing length-n coefficient vector h. The frequency response of h should have an average amplitude of 1 in its passband; with the firls function, this is determined by the entries of the vector m (Eq. 20).

4. Sine-modulate the β filter coefficients to the desired passband center:

$$h_j \leftarrow 2h_j\sin\left(\gamma PBC\left(j\Delta_t - \frac{T}{2}\right)\right), j = 0, \ldots, n-1. \quad (23)$$

5. (Optional) Split and reflect the modulated filter, producing length-2n coefficient vector $\tilde{h}$:

$$\tilde{h}_j = \begin{cases} h_{n/2-1-j}/2, & j=0,\ldots,\frac{n}{2}-1, \\ h_{j-n/2}/2, & j=\frac{n}{2},\ldots,\frac{3n}{2}-1, \\ h_{n-1-(j-3n/2)}/2, & j=\frac{3n}{2},\ldots,2n-1. \end{cases} \quad (24)$$

6. Scale to the desired tip angle and divide by the dwell time to get the sampled $\Delta\omega_{RF}(t)$ waveform $\omega_{RF}$ (in units of radians/second):

$$\Delta\omega_{RF,j} = \frac{\theta}{\Delta_t}\tilde{h}_j, \, j = 0, \ldots, 2n-1. \quad (25)$$

7. Based on the sampled waveform, build the sampled, normalized A(t) waveform a:

$$a_j = \begin{cases} -1, & j = 0, \ldots, \frac{n}{2}-1, \\ 1, & j = \frac{n}{2}, \ldots, \frac{3n}{2}-1, \\ -1, & j = \frac{3n}{2}, \ldots, 2n-1. \end{cases} \quad (26)$$

EXAMPLES

The following examples and results are presented solely for illustrating the various embodiments and are not intended to limit the various embodiments in any way.

Frequency Encoding Validation. First, in order to validate the sequence design, signal expression, and reconstruction based on the BS shift method of the various embodiments, a simulation study was performed in MATLAB. A 1D magnetization profile with a linear $|M_\perp|$ field was used to simulate the signal evolution (intervals (2) and (3) in FIGS. 7 and 8. The 1D object was 5 mm in resolution and 100 mm in size, with 60 degree flip angle homogeneous excitation. The RF pulse was 50 kHz off-resonance, with a maximum field strength of 10 Gauss in the input object. The frequency encoding utilized an ADC dwelltime of 0.04 ms with 50 collected data points. A routine based on the MATLAB function "FSOLVE" and Levenberg-Marquardt algorithm was used to reconstruct the 1D MRI image profile at 50 spatial locations with the above Bloch-simulated signal.

Figure 13:
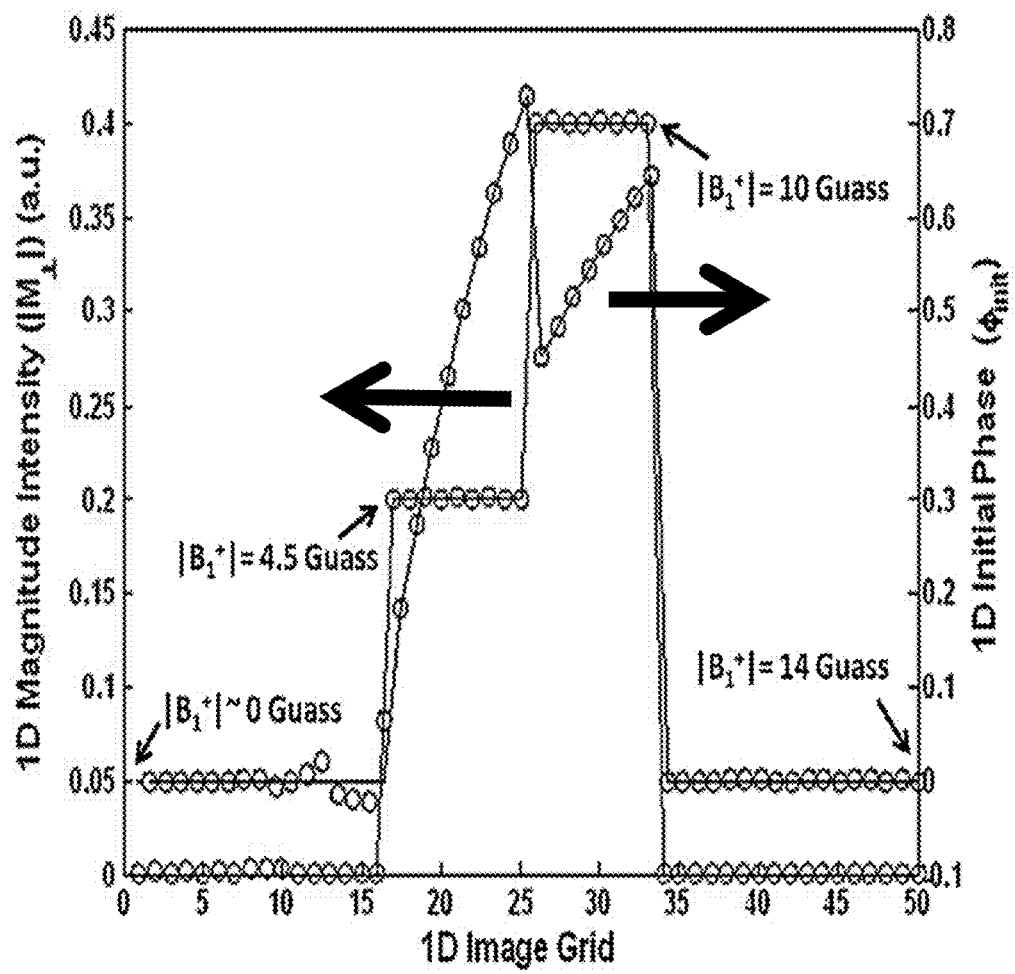
FIG. 13 shows a plot of non-linear image reconstruction based on a Bloch-simulated MRI signal.

The signal expression of Eq. (1) was validated by the fact that the predicted MRI signal substantially matched with that obtained from Bloch simulation. The non-linear image reconstruction results are shown in FIG. 13. FIG. 13 shows a plot of non-linear image reconstruction based on a Bloch-simulated MRI signal. The true object is plotted with a solid line, and the reconstruction output is plotted with circles, demonstrating that both magnitude $|M_\perp|$ and the initial phase $\varphi_{init}$ profiles of the magnetization can be reconstructed using the proposed sequence and reconstruction. Note the presence of Gibbs-like ringing on the left side of the object, where acquired resolution is the lowest.

Selective RF Pulse Validation. Next, phantom experiments were performed to validate control of flip angle, time-bandwidth product, and centering of the pulses designed in accordance with the various embodiments. $|B_1^+|$-Selective pulses were designed in MATLAB, as described above, and deployed on a 31 cm 4.7 T Varian spectrometer (Agilent, Santa Clara, Calif., USA) with a 38 mm Litz volume coil (Doty Scientific, Columbia, S.C., USA) for transmit and receive and a 50 mL, 3 cm diameter/10 cm long vial phantom containing a $CuSO_4$ solution with $T_1 \approx 200$ ms. The pulses were used for excitation in a 3D gradient-recalled echo sequence with FOV 30×30×100 mm, 32×32×32 matrix size, 50 or 100 ms TR and 5 ms TE as measured from the center of the pulses. The pulses were sampled with a 4 μs dwell time, and frequency modulation was converted to phase modulation. To account for finite RF amplifier rise times, 40-sample ramps were placed on either end of the A(t) waveforms, which were paired with 20-sample rewinders with opposite sign to cancel the area of the ramps. These ramps and rewinders are visible on the waveforms in FIG. 13. Because a homogeneous volume coil was used for transmission and reception, the $|B_1^+|$-selective profile of each pulse was measured by repeating the 3D scans over a range of RF amplitudes corresponding to a desired $|B_1^+|$ measurement range. Two additional scans were collected to calculate an off-resonance field map. Those scans had the same volume coverage and matrix size, and a 50 ms TR, but used a 1 ms, 30° Gaussian excitation pulse and TEs of 5 and 6 ms, so that a field map could be calculated from their phase difference. Then, from each $|B_1^+|$-selective excitation pulse's set of 3D acquisitions, the signal for each $|B_1^+|$ was calculated from the corresponding images as the magnitude of the complex average of signal from voxels with off-resonance within ±5 Hz (so as to obtain on-resonance profile measurements), and inside an object mask derived by thresholding one of the off-resonance map acquisition images at 15% of the peak image magnitude.

Simulations were performed to characterize the sensitivity of $|B_1^+|$-selective pulses to off-resonance, and to compare them to BIR-4 adiabatic pulses staewen19903 in terms of off-resonance sensitivity and threshold $|B_1^+|$. A hard pulse approximation-based Bloch simulator was used, with a 2 μs dwell time for the off-resonance simulation, and a 4 μs dwell time for the BIR-4 comparison. The simulations assumed excitation of $^1H$, so that $$\frac{\gamma}{2\pi} = 4257 \, \text{Hz/Gauss}.$$

Figure 14:
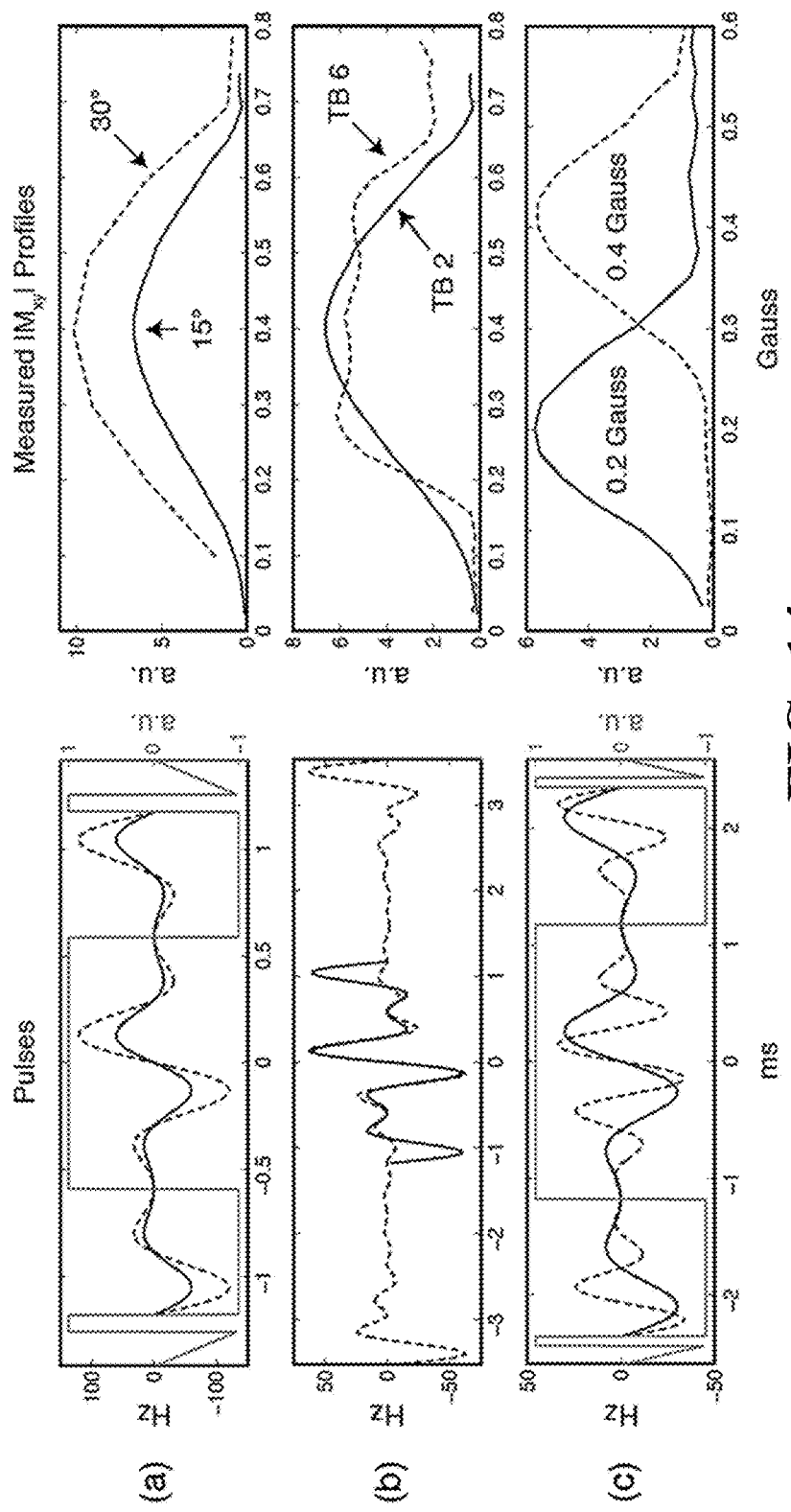
FIG. 14 shows the pulses played out in the experiments and the resulting measured $|B_1^+|$-selective profiles.

FIG. 14 shows the pulses played out in the experiments and the resulting measured $|B_1^+|$-selective profiles. In (a), FIG. 14 shows a comparison of signal profiles for nominal 15° and 30° excitations, with duration 2.83 ms, 0.4 Gauss/1.7 kHz slice width, TB=2 (Gaussian-like profile), and centered at 0.4 Gauss/1.7 kHz. The signal intensity from the 30° excitation is larger and consistent with increased excitation and $T_1$-weighting. In (b), FIG. 14 shows a comparison of TB=2 (2.37 ms) and TB=6 (6.13 ms) pulses and signal profiles, with a nominal 15° flip angle, 0.5 Gauss/2.1 kHz slice width, and centered at 0.5 Gauss/2.1 kHz. The TB=6 pulse has narrower transition regions from stop to pass, reflecting the higher selectivity it was designed to have. In (c), FIG. 14 shows a comparison of the 15° TB=2 (5.74 ms) excitations, centered at 0.2 Gauss/850 Hz and 0.4 Gauss/1.7 kHz. The two pulses' profiles are centered in the intended locations, but otherwise appear very similar.

Figure 15:
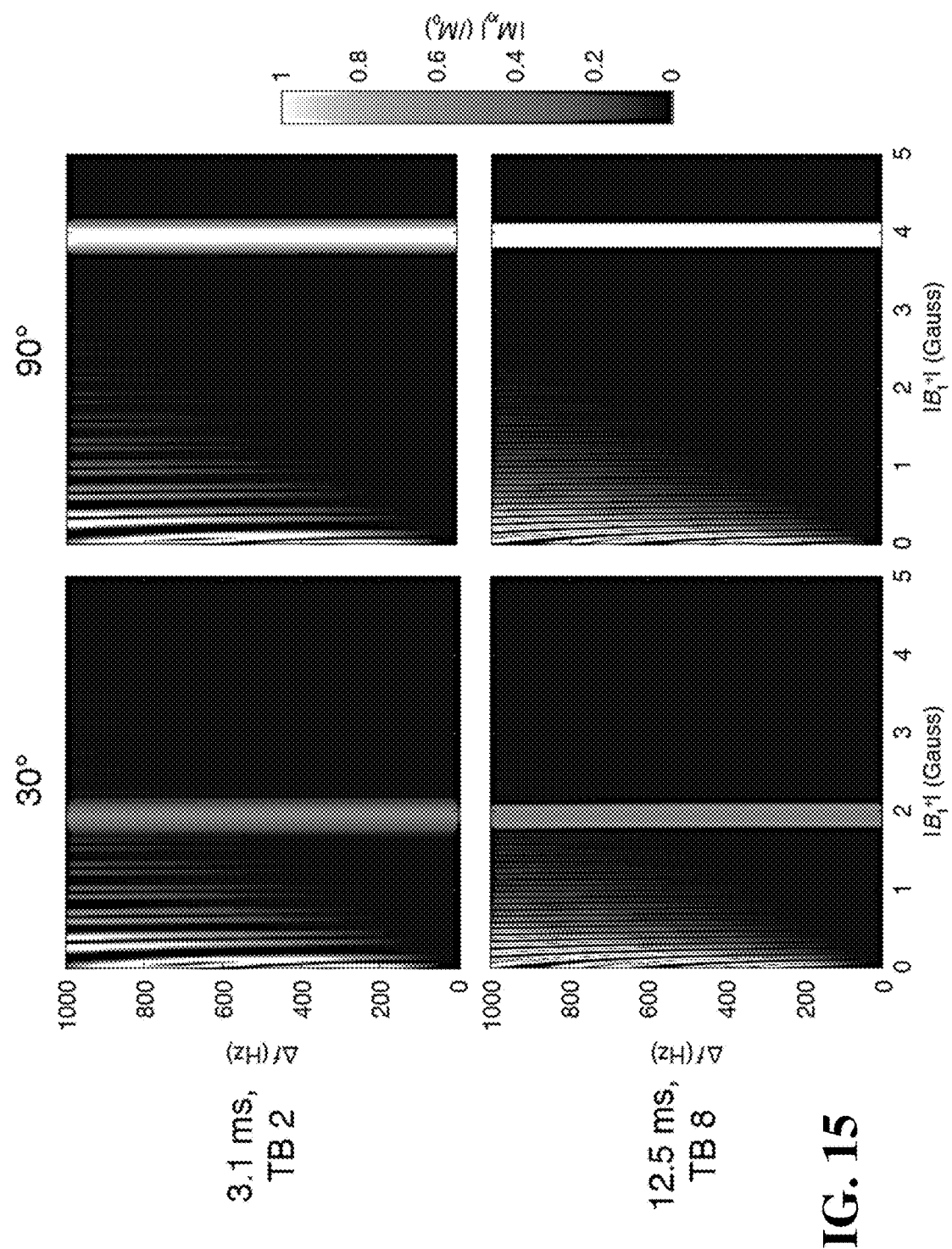
FIG. 15 shows the off-resonance simulation results.

FIG. 15 shows the off-resonance simulation results. The top row shows $|M_{xy}|$ patterns excited by 3.1 ms TB=2 pulses at 30° and 90°, centered at 2 and 4 Gauss/8.5 and 17 kHz, with 0.3 Gauss/1.3 kHz passband width, across a 1 kHz range of off-resonance frequencies ($\Delta f_0$). The bottom row shows 12.5 ms TB=8 pulses, for the same flip angles, profile centering and passband widths. The pattern of unintended excitation appears to depend primarily on the duration of the pulse, rather than the amplitude or centering of the pulses. There is larger unintended excitation for lower $|B_1^+|$.

In all, four $|B_1^+|$-selective pulses were simulated: two 3.1 ms TB=2 pulses at 30° and 90° and centered at 2 and 4 Gauss/8.5 and 17 kHz, with 0.3 Gauss passband width, and two 12.5 ms TB=8 pulses, for the same flip angles, profile centering and passband widths. All four designs used $\delta_{1,e} = \delta_{2,e} = 0.01$. The two-dimensional patterns of unwanted excitation due to off-resonance appear the same for a given duration. This suggests that off-resonance sensitivity primarily depends on pulse duration and the shape of the A(t) waveform, rather than on the flip angle and profile centering, which are characteristics that determine the shape and amplitude of the $\Delta\omega_{RF}(t)$ waveform. As might be expected, near $|B_1^+|=0$, the shorter 3.1 ms pulse appears to have a wider frequency bandwidth over which unwanted excitation is insignificant. Further, in all cases the unwanted excitation decays rapidly as $|B_1^+|$ increases. Note that the $|M_{xy}|$ patterns shown in FIG. 15 are Hermitian symmetric about the $|B_1^+|$ axis, and are therefore displayed only for positive off-resonance frequencies.

Figure 16A:
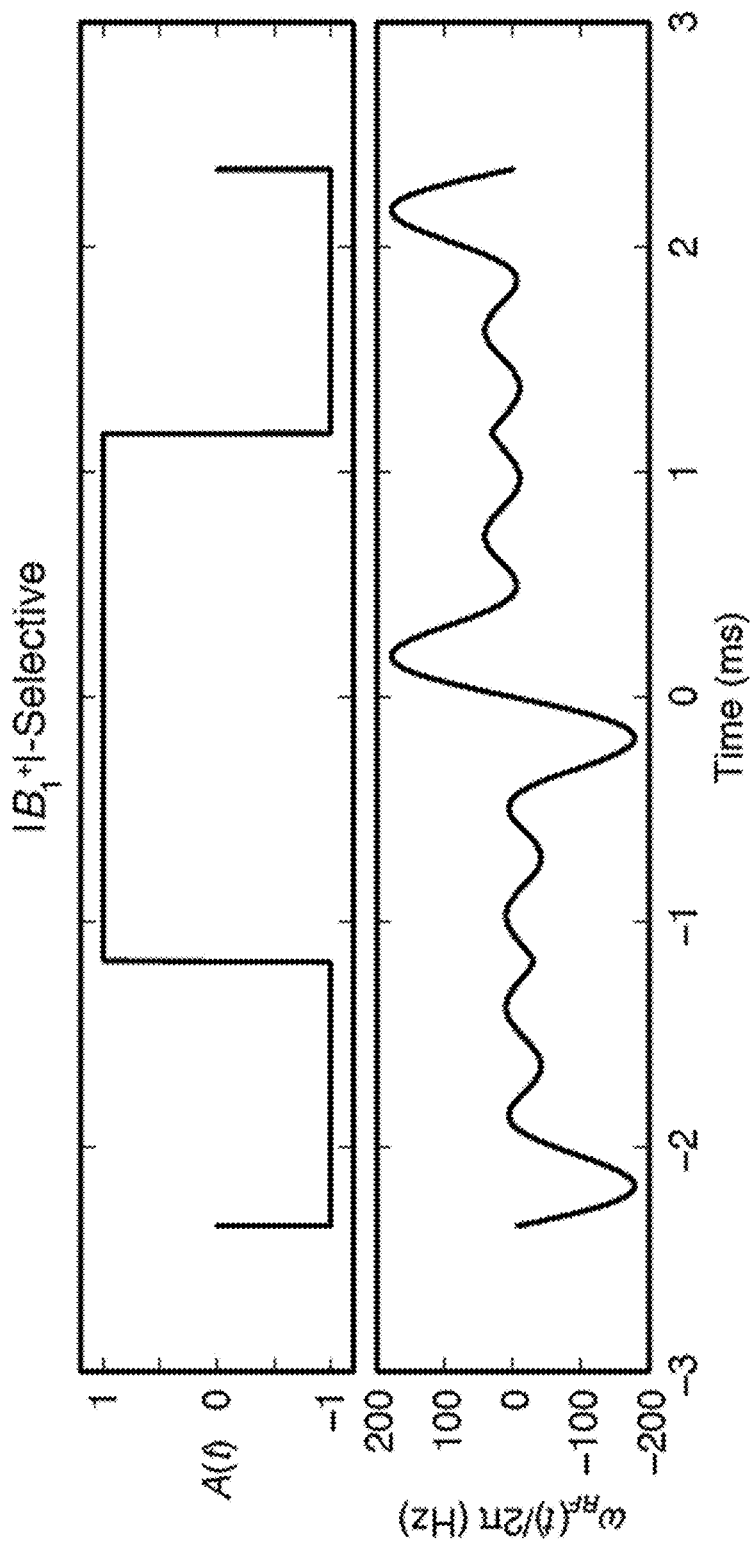
FIGS. 16A, 16B, 16C, and 16D show BIR-4 comparison results.
Figure 16B:
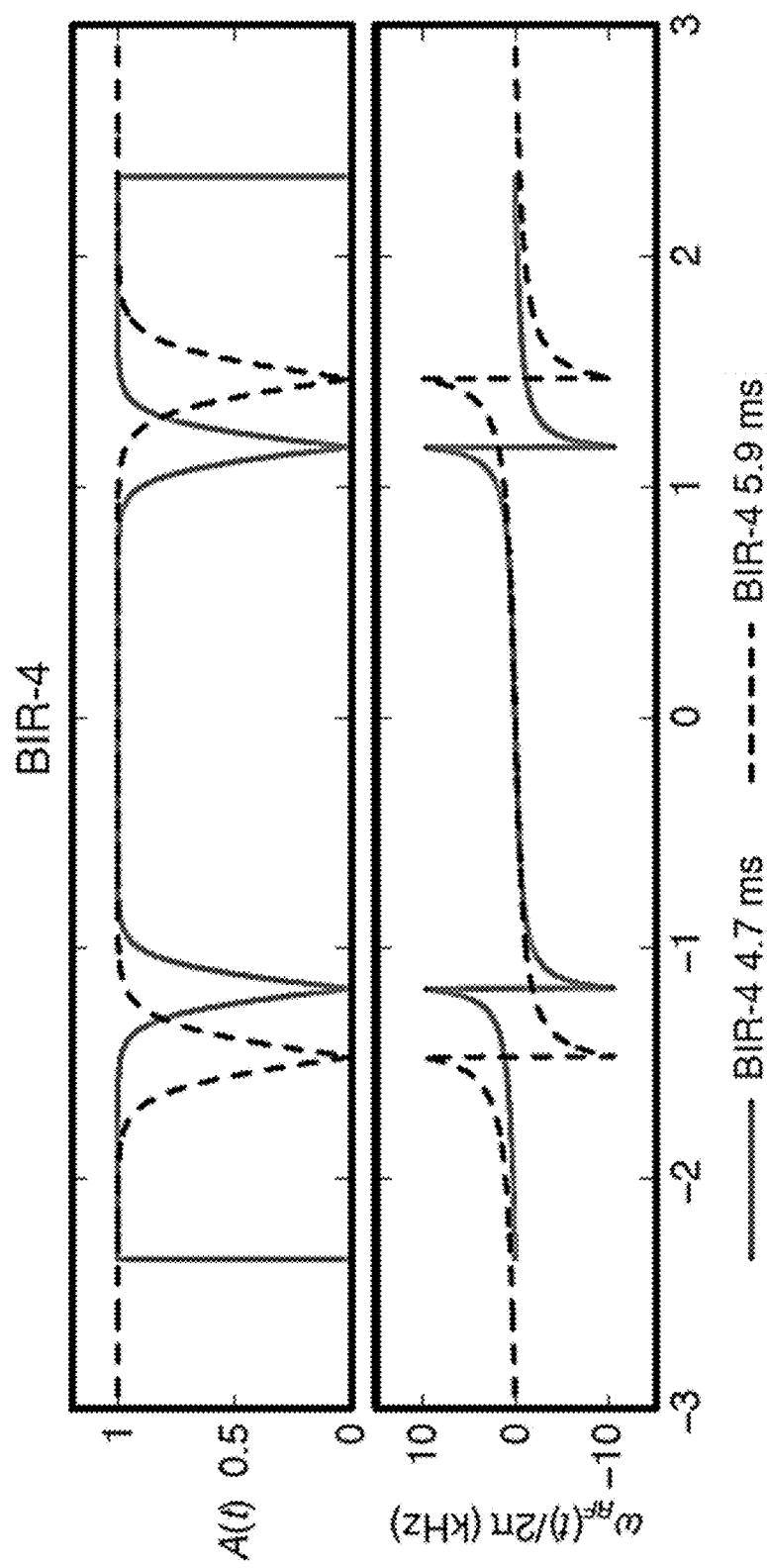
Figure 16C:
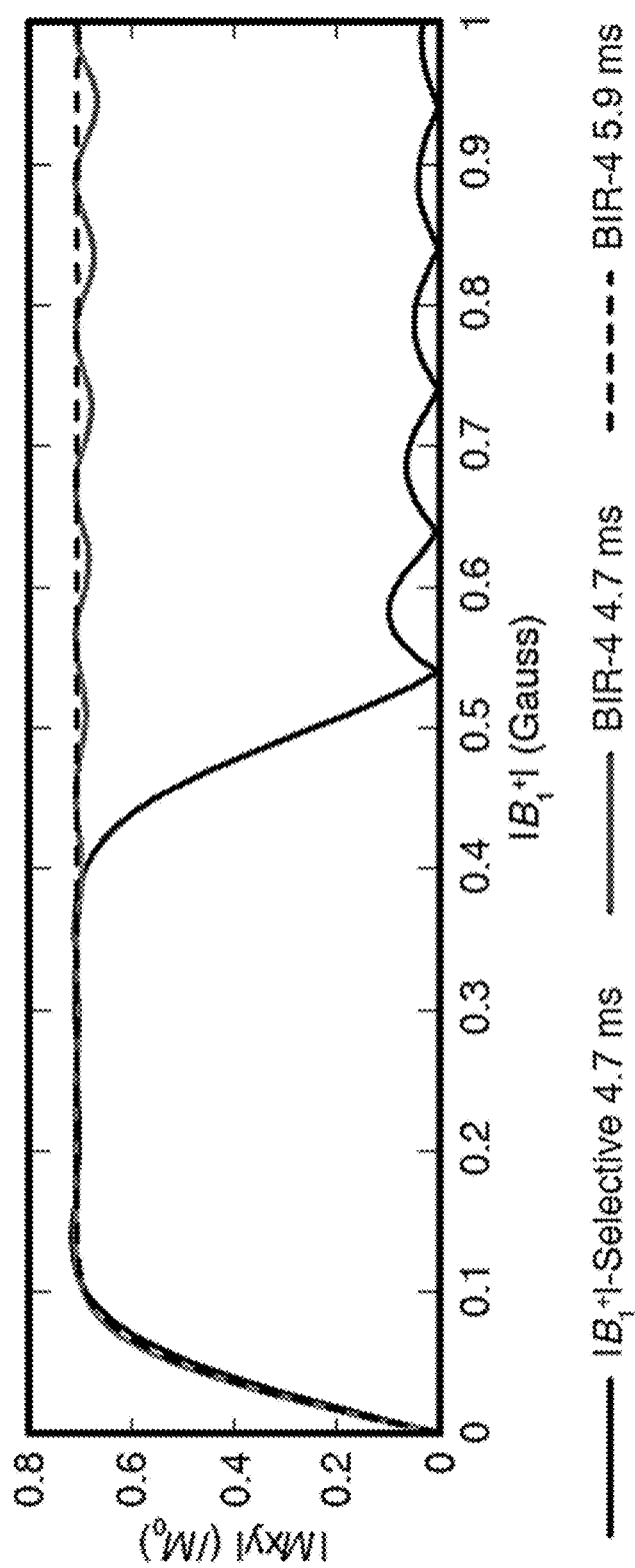
Figure 16D:
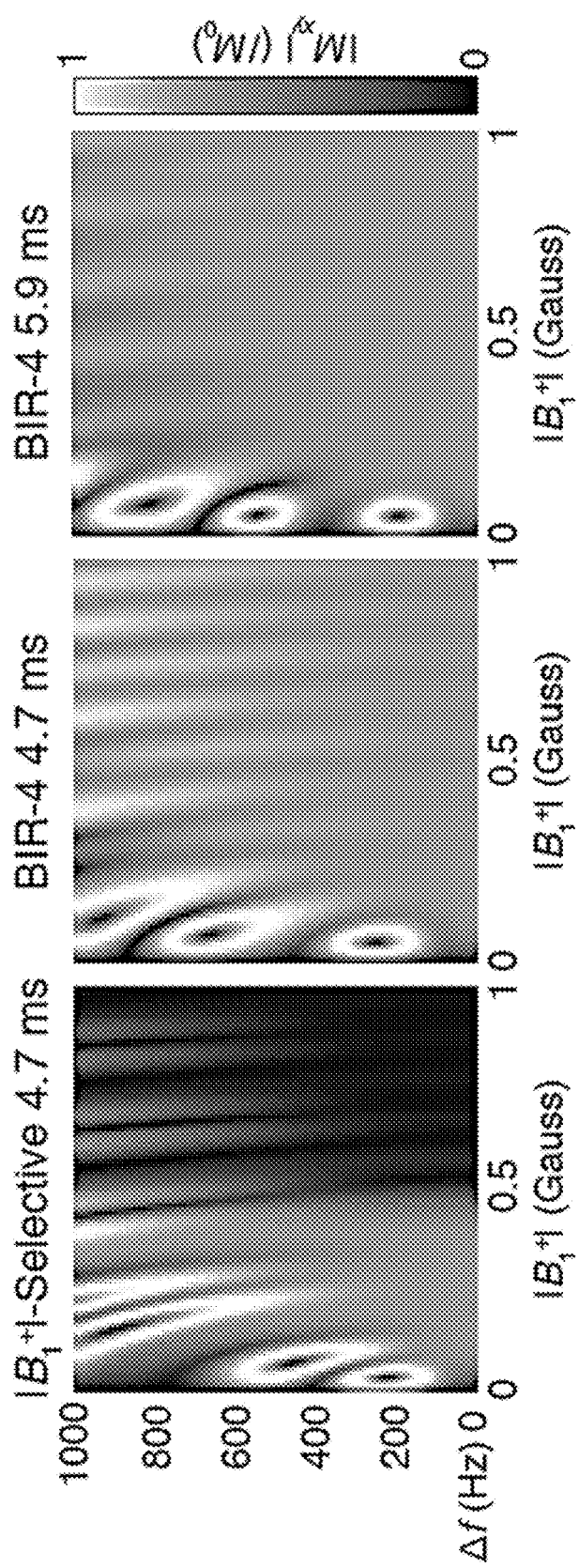

FIGS. 16A-16D shows the BIR-4 comparison results. In FIG. 16A, there is shown a comparison of 45° RF waveforms, showing the 4.7 ms TB=4 $|B_1^+|$-selective excitation pulse. FIG. 16B shows two BIR-4 pulses: a duration-matched 4.7 ms pulse with parameters tuned for minimum threshold $|B_1^+|$, and a longer 5.9 ms pulse with the same transition width but better robustness to off-resonance. In FIG. 16C, there is shown simulated $|M_{xy}|$ profiles at 0 Hz, illustrating that the three pulses have approximately the same threshold $|B_1^+|$ at which a 45° excitation is achieved. In FIG. 16D, there is shown simulated $|M_{xy}|$ patterns over a 1 kHz off-resonance ($\Delta f_0$) range. The three pulses have similar off-resonance sensitivity for low $|B_1^+|$. As $|B_1^+|$ increases, the 4.7 ms $|B_1^+|$-selective and BIR-4 pulses have similar distortion patterns, but the 5.9 ms BIR-4 pulse has a more uniform excitation pattern across $|B_1^+|$ and off-resonance.

A 4.7 ms, TB=4 $|B_1^+|$-selective pulse was designed to excite a 45° tip angle, with a passband width of 0.4 Gauss/1.7 kHz, and ripples $\delta_{1,e}=0.01$ and $\delta_{2,e}=0.4$. The high $\delta_{2,e}$ was used to reflect the fact that the stopband above the passband was a 'don't-care' region. The passband was placed as close to $|B_1^+|=0$ as possible, so direct weighted-least squares dual-band FIR filter design was used to design the β filter. Two BIR-4 pulses were then designed: one with the same 4.7 ms duration as the $|B_1^+|$-selective pulse, and one longer 5.9 ms pulse. The 4.7 ms BIR-4 pulse design used $\Delta\omega_{RF}^0=100$ π/T radians/second, β=10, and κ=$\tan^{-1}20$ staewen19903. These parameters were empirically selected to match the threshold $|B_1^+|$ and passband ripple of the $|B_1^+|$-selective pulse. The 5.9 ms BIR-4 pulse design used the same $\Delta\omega_{RF}^0$ and β, but its longer duration enabled use of a less-aggressive κ=$\tan^{-1}$ 15. All pulses are plotted in FIG. 16A. Note that there is a π+π/8 phase shift (not shown) between the central and outer lobes of the BIR-4 pulses' A(t) waveforms, to affect the 45° tip angle. As discussed above, FIG. 16C plots the $|M_{xy}|$ profile of each pulse at 0 Hz. All three pulses have approximately the same threshold $|B_1^+|$, and approximately the same ripple across the passband. The longer 5.9 ms BIR-4 pulse achieved the same threshold $|B_1^+|$ as the 4.7 ms BIR-4 pulse, without requiring a large κ. As noted above, FIG. 16D compares the off-resonance sensitivity of the three pulses. The pulses all have similar off-resonance sensitivity near $|B_1^+|=0$, in the transition up to their passbands. In the passband, the $|B_1^+|$-selective pulse appears to have similar off-resonance sensitivity to the 4.7 ms BIR-4 pulse, but the 5.9 ms BIR-4 pulse is significantly more robust to off-resonance than either 4.7 ms pulse.

The results of FIGS. 16A-16D show that $|B_1^+|$-selective pulses achieve similar $|B_1^+|$ thresholds as BIR-4 pulses of the same duration. The proposed algorithm will enable the user to directly specify the $|B_1^+|$-threshold and the $|B_1^+|$ range over which a given tip angle is desired, within a given tip angle error tolerance, and the algorithm will produce the shortest possible pulse that meets those requirements. Given the results presented in FIGS. 16A-16D, though, replacing adiabatic pulses with $|B_1^+|$-selective pulses may only be feasible when broad robustness to off-resonance is not a primary design objective.

Figure 17B:
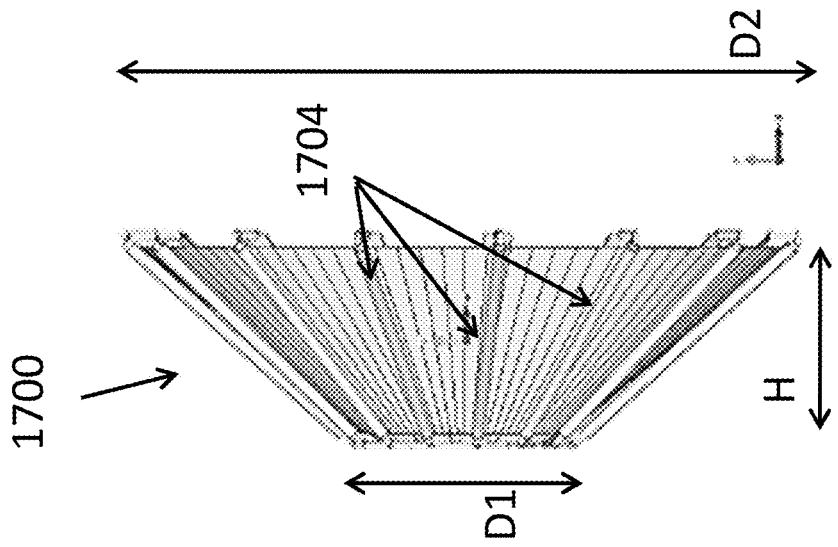
FIGS. 17A and 17B show view of a z-gradient coil in accordance with the various embodiments.
Figure 17A:
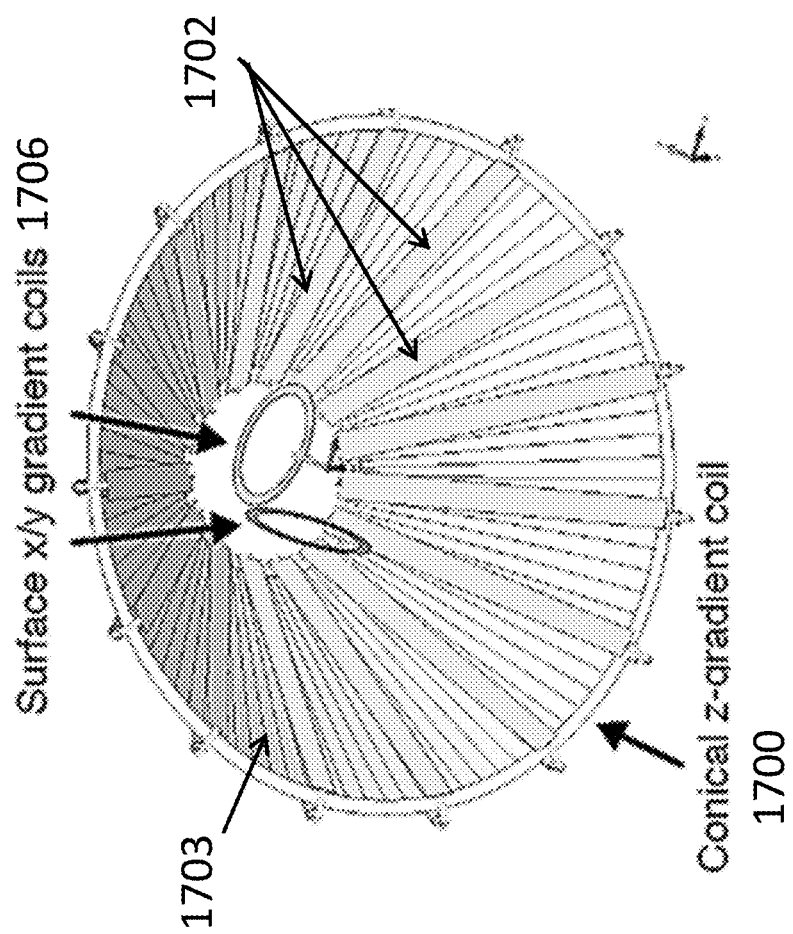

Z-Gradient Coils. While many studies have implemented RF encoding using surface coils, it is less clear how to build z-gradient RF coils. A z-gradient coil will nominally produce a large RF magnitude gradient in the z-direction, but a uniform RF magnitude field in any transverse slice along z. One option is to utilize saddle and toroidal z-gradient RF coil designs, which both use conical formers. A conical toroidal z-gradient coil 1700 in accordance with the various embodiments is illustrated in FIGS. 17A and 17B, which show bottom perspective and side views of the coil 1700. As shown in FIGS. 17A and 17B, the coil 1700 is conical and is characterized by an odd number of copper strips 1702 on the inner surface of the coil 1702 and coaxial lines 1704 connecting adjacent strips on the outer surface of the coil 1700. The shape of the coil 1700 is defined by a non-metallic conical former 1703, such as a former comprising plastic, fiberglass, or other non-metallic structure. The former 1703 will have a concave or convex inner surface to approximate a square-root field variation for linear phase encoding. The surface x/y gradient coils 1706 can be disposed within the coil 1700.

Figure 18:
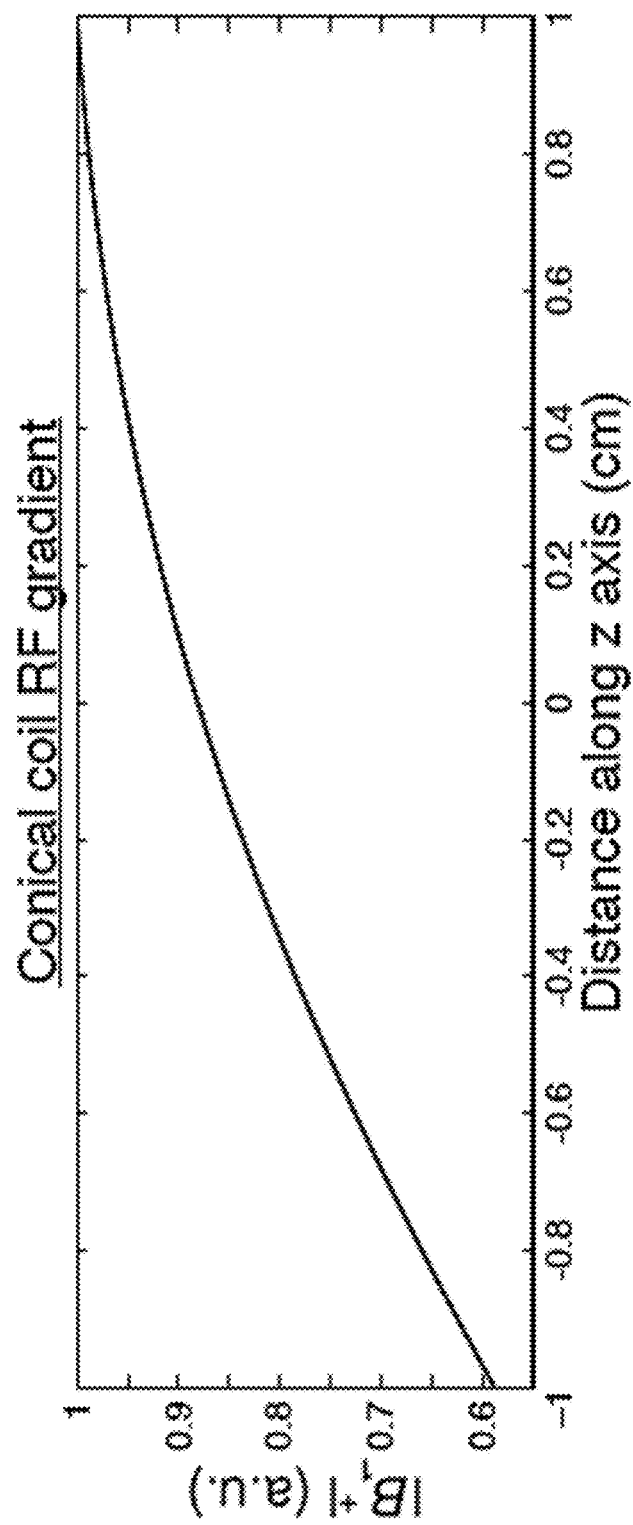
FIG. 18 an x-y plot of $|B_1^+|$ as a function of distance along the z-direction or axis for a coil configured in accordance with FIGS. 17A and 17B.

In one particular embodiment, the former 1703 is configured to provide a cone defining the coil 1700 with a depth or height (H) of 3 cm, a smaller diameter (D1) of 3 cm and a larger diameter (D2) of 9 cm. The surface coils 1706 have diameter 24 mm. (b) With these design parameters the resulting z-gradient coil produces a monotonic $|B_1^+|$ field along its z-axis. This is illustrated in FIG. 18, which shows an x-y plot of $|B_1^+|$ as a function of distance along the z-direction or axis.

Decoupling Strategies. In some implementations, passive decoupling and filtering efforts may not sufficiently attenuate the transmit signal in the receive path during RF frequency encoding. In such cases, a transmit array decoupling method can be implemented. This method uses multiple transmit coils and channels whose relative amplitudes and phases are adjusted to achieve zero total current induced in a receive coil. FIGS. 19A. 19B, and 19C illustrate some exemplary decoupling strategies for simultaneous RF transmission and reception. A first strategy, as shown in FIG. 19A, is a "No Decoupling" configuration in which two coils (one for receive, one for transmit) are oriented 90 degrees apart. A second strategy, as shown in FIG. 19B, is an "Overlapped" configuration where the two surface coils are oriented 90 degrees apart with a small overlap. A third configuration, as shown in FIG. 19C, is an "Array Decoupling" configuration, where three identical coils are arranged in a triangle, with two coils designated for transmission and one coil for receive. As shown in FIGS. 19A-19C, it is possible to reach nearly a 70 dB decoupling between two transmit coils and one receive coil at 20 MHz using this decoupling method alone, as measured using a software-defined radio with two transmit channels. Combining this with passive decoupling methods it should enable any required level of decoupling, at the cost of increased system complexity. It may also create new opportunities to improve the spatial encoding fields.

Figure 20A:
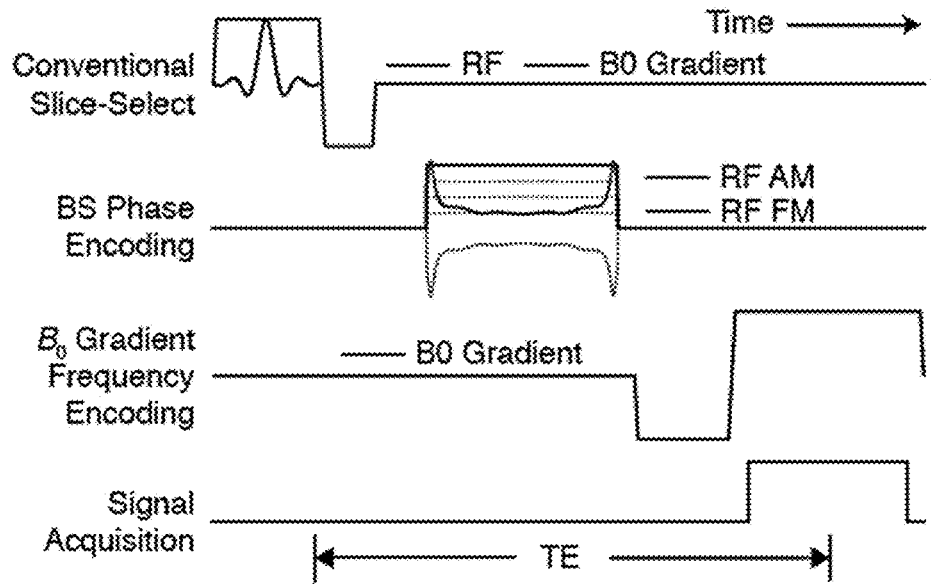
FIGS. 20A, 20B, and 20C show construction of fully RF-encoded 2D multislice and 3D gradient-recalled echo and spin echo imaging RF pulse sequences.
Figure 20B:
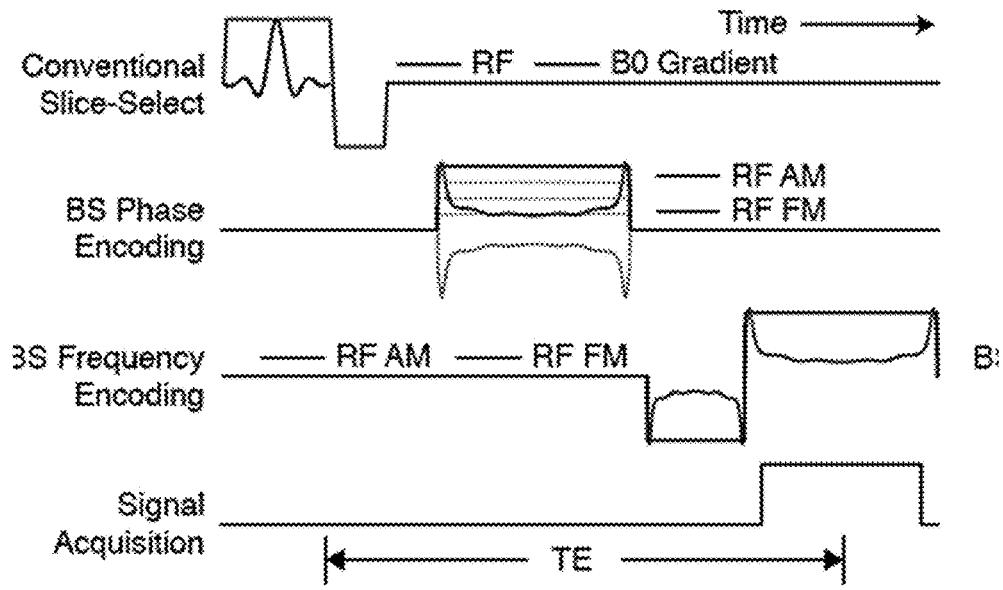
Figure 20C:
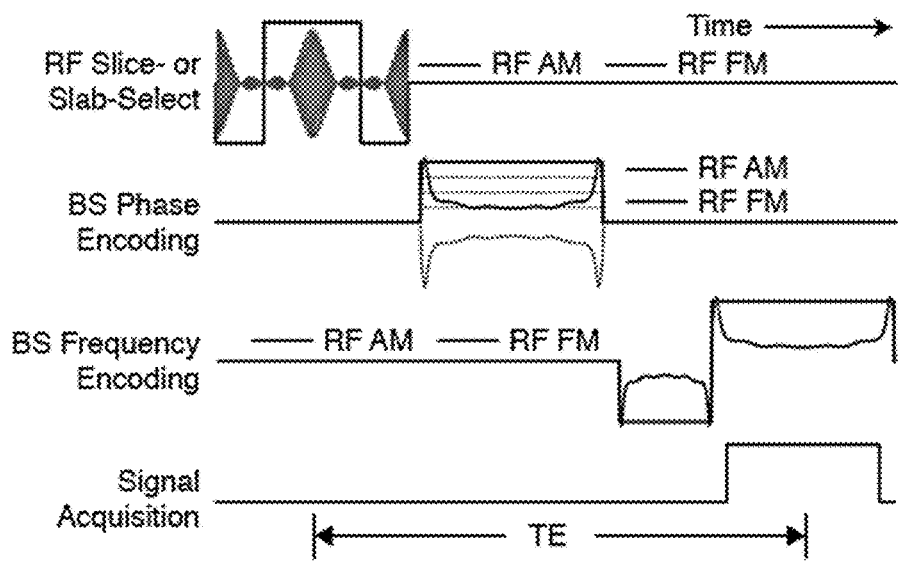

Pulse Sequence Construction. Based on the foregoing, it is then possible to construct fully RF-encoded 2D multislice and 3D gradient-recalled echo and spin echo imaging RF pulse sequences. In one exemplary implementation, these can be developed in three stages, as shown below and as illustrated in FIGS. 20A, 20B, and 20C.

Step 1: Phase-encoded imaging. 1D and 2D RF gradient-based phase encoding can be implemented using surface RF gradient coils. Non-RF-encoded dimensions will be resolved using $B_0$ gradients. Three approaches can be used to increment the BS encoding phase: incrementing the pulse's duration, amplitude, and offset frequency. A best approach will minimally and consistently perturb magnetization across acquired projections, and will have minimal and consistent off-resonance sensitivity. Whereas some have used hard pulses for BS phase encoding with a large fixed frequency offset (e.g., 600 kHz) to avoid on-resonance excitation, one can use optimized frequency-swept pulses which should enable much lower frequency offsets and consequently much lower RF power levels. For example, one can target a maximum 100 kHz offset in the center of the pulses, which will reduce RF power by a factor of six compared to the hard pulse approach for the same phase gradient. FIG. 20A illustrates a gradient-recalled echo pulse sequence resulting from this step, where $B_0$ gradient phase encoding is replaced by BS phase encoding.

Step 2: Phase- and frequency-encoded imaging. One can then develop BS frequency encoding. As in phase encoding, the BS frequency-encoding pulses should produce a large frequency shift with minimal on-resonant excitation. But, whereas BS phase-encoding pulses need only produce minimal on-resonant excitation as evaluated at the end of the pulse, BS frequency-encoding pulses should minimally tip magnetization throughout the time period during which the scanner's receiver is switched on to sample the signal. In some cases, the critical design feature of these pulses will be the ramp up to full-scale RF amplitude, which can produce significant on-resonant excitation. By optimizing the rate of frequency sweeps of each, the ramp-up excitation can be canceled by the ramp down, while the center, constant-frequency portion of the pulses is primarily responsible for the BS phase accrual but produces little tip. Based on this, to design frequency-encoding BS pulses, one can divide the pulses into: 1) a numerically-optimized ramp-up segment; 2) a full-scale amplitude, constant frequency-offset segment, during which the ADC window is placed; and 3) a numerically-optimized ramp-down segment. FIG. 20B illustrates a n exemplary gradient-recalled echo pulse sequence resulting from this step, where B0 gradient phase and frequency encoding are replaced by BS phase encoding.

Step 3: 2D and 3D phase- and frequency-encoded imaging with RF slice-selection. The final step will be dependent on the z-gradient RF coil utilized, which will be used to perform slice- or slab-selection with our $B_1^+$-selective pulses, and to phase-encode the third dimension in 3D acquisitions. An extension of the described $B_1^+$-selective pulse design algorithm to the refocusing case could be used to design refocusing pulses for multi-slice spin echo acquisitions, or $B_1^+$-selective refocusing pulses could be designed using existing optimal control algorithms. As an example, if the described $B_1^+$-selective pulse design algorithm were used, a $B_1^+$-selective pulse that excites a 0.15 mm slice with a commonly-used time-bandwidth product of 4 will have a duration of 7.0 ms for a minimum targeted 18 Gauss/cm gradient strength from Aim 1. FIG. 20C illustrates a $B_0$ gradient-free gradient-recalled echo pulse sequence resulting from this step, wherein $B_0$ gradient-based phase encoding, frequency encoding, and slice selection are all replaced by RF encoding.

Potential problems and alternative strategies. If one arrives at Step 3 before a z-gradient coil is available, one could perform 2D imaging using the two surface RF gradient coils. One for slice-selective excitation and the other for phase or frequency encoding, and using a $B_0$ gradient for the second encoded dimension. RF phase cycling and crushing using BS phase-encoding pulses may be required to spoil the transverse magnetization left over after signal acquisition. However, the latter solution would increase the total RF power of the sequence.

Simulation Results

Figure 21A:
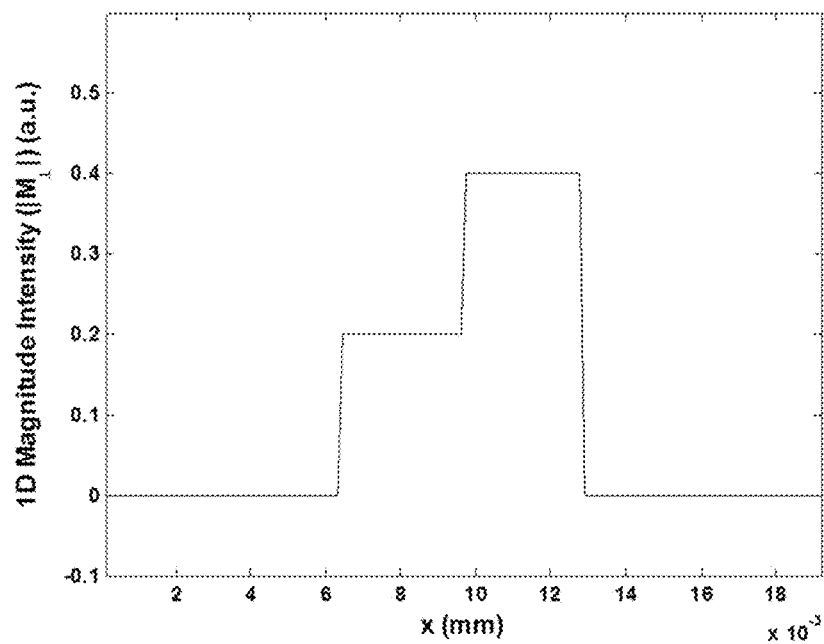
FIGS. 21A and 21B show plots of a simulated object magnitude and phase.
Figure 21B:
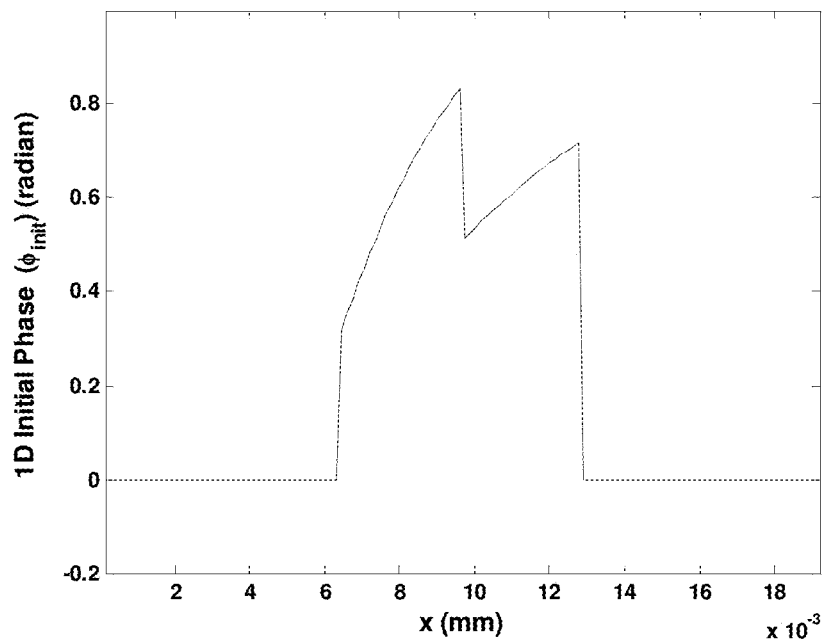

Based on the foregoing, simulations were performed to investigate: (1) resolution and imaging field-of-view (FOV) relationships, signal-to-noise (SNR) sensitivity, and appearance of chemical shift artifacts. The simulations were performed using linear and non-linear reconstruction methods for $M_\perp$ to look at the effect on encoded resolution, encoded FOV, collected data points, noise, and chemical shift artifacts. For the simulations, the linear approach is a matrix inversion reconstruction based on linearizing the signal equation assuming small $B_{\mathit{eff}}$ angle (cos θ=1). The non-linear approach is non-linear least squares fitting of the signal equation, using the fsolve( ) routine in MATLAB. Further, for the simulations, a simulated object magnitude and phase was provided, as shown in FIGS. 21A and 21B. The linear reconstruction approach will have short computation times but may produce unacceptable reconstruction errors, while the non-linear approach will have longer computation times but will be capable of more accurate reconstructions.

In the following figures, the "Truth" curves are the magnitude and phase curves of FIG. 21A. The "Linear Approx" curves are the simulated magnitude and phase curves for the linear reconstruction approach. Finally, the "Fitting" curves are the simulated magnitude and phase curves for the non-linear fitting approach, as discussed above.

Figure 22A:
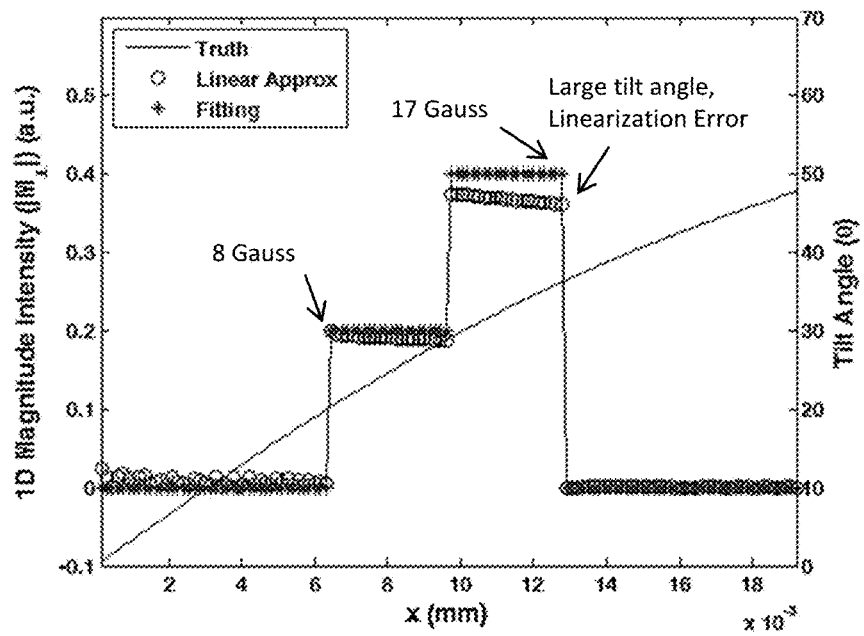
FIGS. 22A and 22B show x-y plots of 1D magnitude intensity and tilt angle as a function of distance (x) for different encoded resolutions.
Figure 22B:
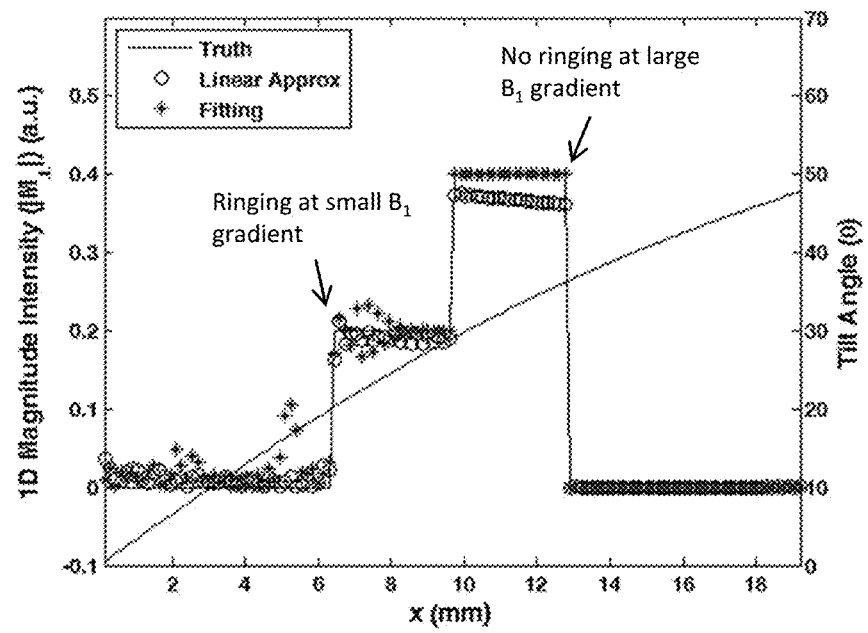

First, the effect of encoded resolution (Δx) is shown in FIGS. 22A and 22B, where there are shown x-y plots of 1D magnitude intensity and tilt angle as a function of position (x). In FIGS. 22A and 22B, the encoded resolution is 0.14 mm (T=3.6 ms) and 0.21 mm (T=2.3 ms), respectively. These figures show that as the encoded resolution decreases, ringing first appears where $|B_1|$ is lowest, due to the approximate dependence of applied phase gradient on $|B_1|^2$. Thus, FIGS. 22A and 22B show that ringing can be avoided where there is an adequate encoded resolution.

Figure 23A:
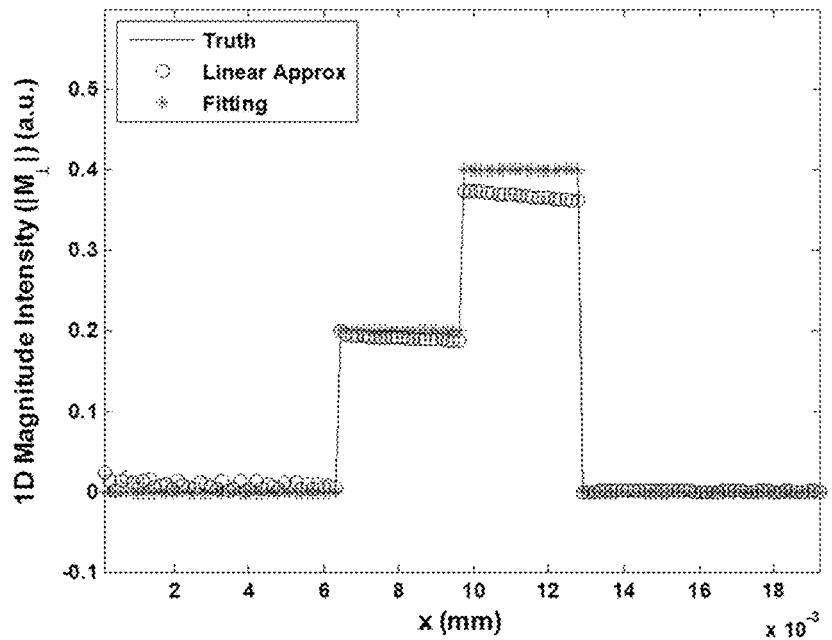
FIGS. 23A and 23B show x-y plots of 1D magnitude intensity as a function of distance (x) for different encoded fields-of-view.
Figure 23B:
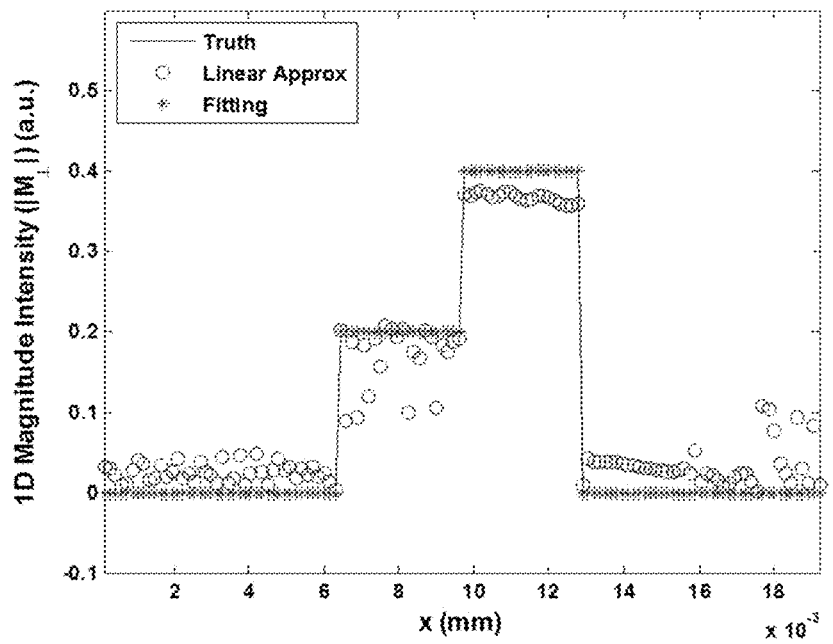

Second, the effect of encoded FOV is shown in FIGS. 23A and 23B, where there are shown x-y plots of 1D magnitude intensity as a function of position (x). In FIGS. 23A and 23B, the encoded FOV is 21 mm (Δt=14 μs) and 10.5 mm (Δt=28 μs), respectively. These figures show that as the encoded FOV decreases, the number of acquired points remains adequate, the linear approximation recon fails, but the fitting recon remains accurate. Thus, FIGS. 22A and 22B show that ringing can be avoided where there is an adequate encoded FOV.

Figure 24A:
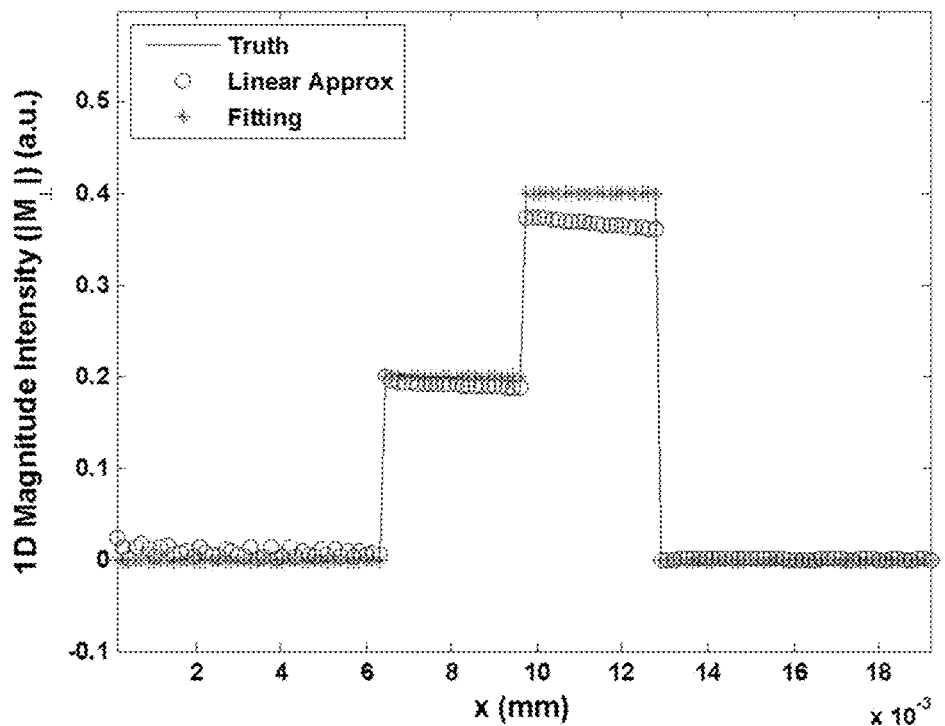
FIGS. 24A and 24B show x-y plots of 1D magnitude intensity and tilt angle as a function of distance (x) for different numbers of data points.
Figure 24B:
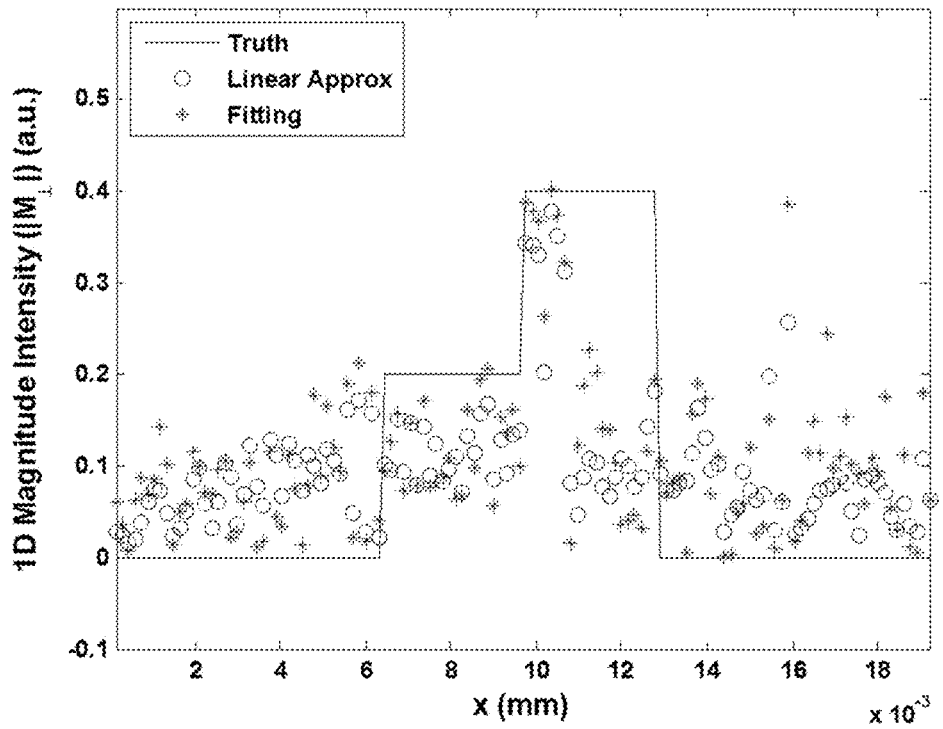
Figure 25A:
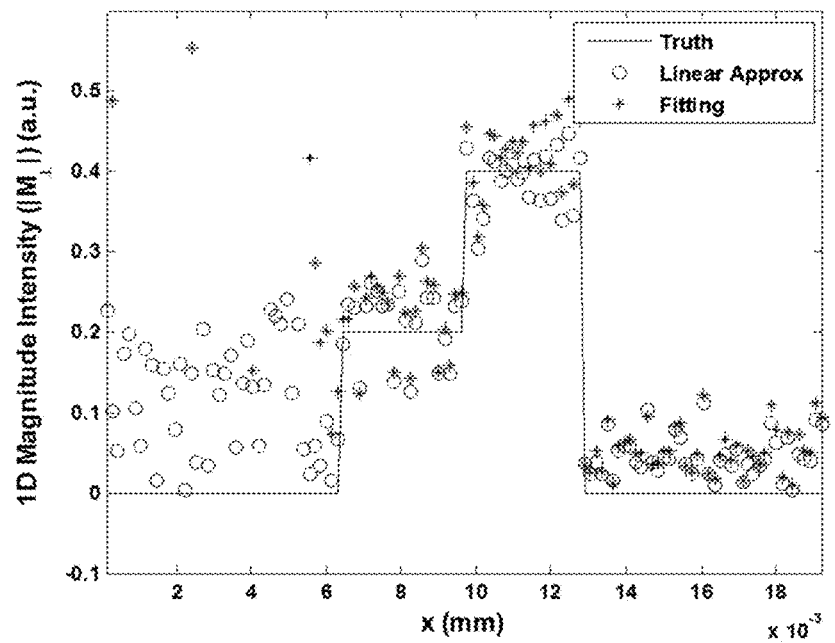
FIGS. 25A, 25B, 25C, and 25D show x-y plots of 1D magnitude intensity and tilt angle as a function of distance (x) for different amounts of signal-to-noise.
Figure 25B:
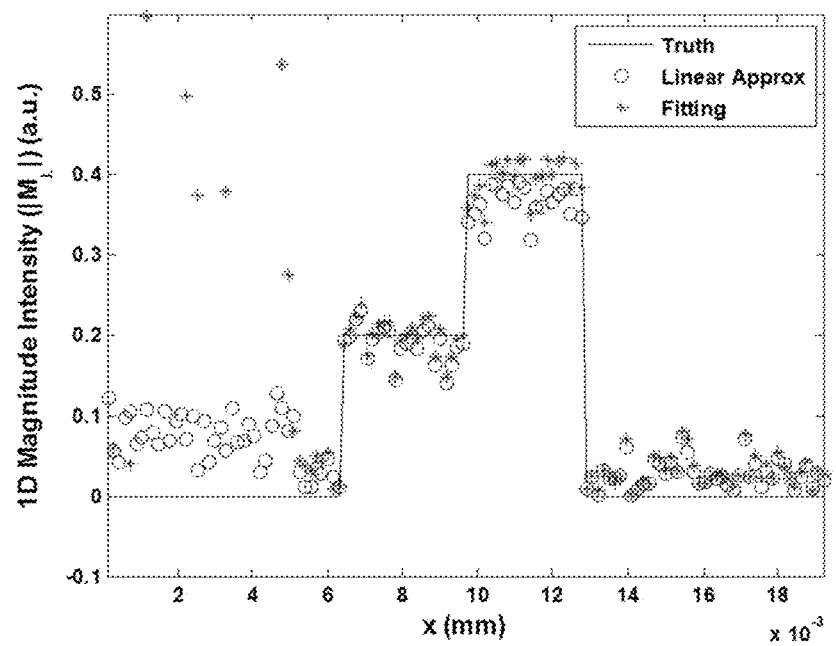
Figure 25C:
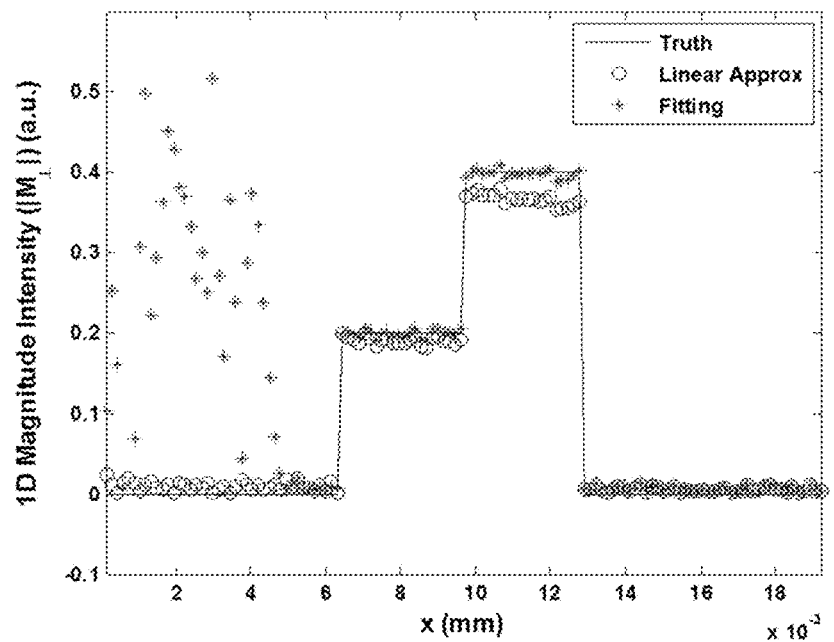
Figure 25D:
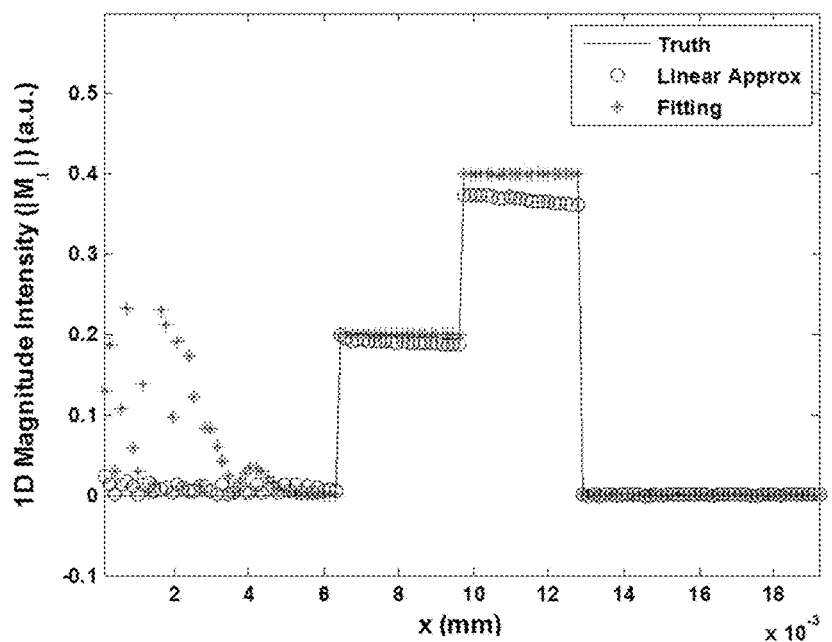

Third, the effect of the number of collected data points is shown in FIGS. 24A and 24B, where there are shown x-y plots of 1D magnitude intensity as a function of position (x). In FIGS. 24A and 24B, the number of collected data points is 256 and 64, respectively. These figures show that as the number of points decreases, the reconstructions (linear and non-linear) fail as essentially there are fewer measurements (equations) than unknowns and a solution cannot be obtained.

Fourth, the effect of SNR is shown in FIGS. 25A, 25B, 25C, and 25D, where there are shown x-y plots of 1D magnitude intensity as a function of position (x). In FIGS. 25A, 25B, 25C, and 25D, SNR is set to 0.4, 0.8, 4, and 40, respectively. These figures show that both reconstruction techniques are sensitive to noise (e.g., FIG. 25A). However, as SNR increase, the linear reconstruction is less sensitive to noise, as reconstructed SNR is spatially dependent.

Overall, these simulation results support the theoretical predictions of Equations 1-7.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A method of magnetic resonance imaging comprising:
    generating an magnetic resonance (MR) signal for a volume of interest, the generating comprising: providing an excitation pulse for a volume of interest, the excitation pulse comprising a $B_1^+$-selective radio frequency (RF) pulse, and providing spatial encoding for the volume of interest via an RF gradient field, the RF gradient field configured to provide frequency encoding of spatial location information for spatial locations in the volume of interest;
    detecting the MR signal; and
    reconstructing an image for the volume of interest based on the MR signal.

2. The method of claim 1, wherein the providing of the spatial encoding comprises using Bloch-Siegert shift encoding sequence to provide the frequency encoding for the RF gradient field.

3. The method of claim 1, wherein the providing of the excitation pulse comprises designing the $B_1^+$-selective radio frequency (RF) pulse using a Shinnar-Le Roux algorithm.

4. The method of claim 3, wherein the Shinnar-Le Roux algorithm comprises:
    calculating a duration of a half-pulse and the number of samples in the half-pulse;
    calculating inputs for a finite impulse response (FIR) β filter;
    running an FIR filter design tool to design the FIR β filter;
    sine-modulating coefficients for the FIR β filter to a target passband center;
    scaling to the desired tip angle and divide by the dwell time to get a sampled waveform; and
    building a normalized waveform based on the sampled waveform.

5. The method of claim 4, further comprising splitting and reflecting the modulated filter.

6. The method of claim 4, wherein the inputs comprise normalized band edges, an amplitude of frequency response at the normalized band edges, and band error weights.

7. The method of claim 1, wherein the RF gradient field is generated via modulation of at least one of an amplitude or a frequency of an RF electromagnetic field.

8. A non-transitory computer-readable storage medium having stored thereon a computer program for controlling magnetic resonance imaging (MRI) system, the computer program comprising instruction for causing the MRI system to perform a method comprising:
    generating an magnetic resonance (MR) signal for a volume of interest, the generating comprising: providing an excitation pulse for a volume of interest, the excitation pulse comprising a $B_1^+$-selective radio frequency (RF) pulse, and providing spatial encoding for the volume of interest via an RF gradient field, the RF gradient field configured to provide frequency encoding of spatial location information for spatial locations in the volume of interest;
    detecting a MR signal; and
    reconstructing an image for the volume of interest based on the MR signal.

9. The non-transitory computer-readable storage medium of claim 8, wherein the providing of the spatial encoding comprises using Bloch-Siegert shift encoding sequence to provide the frequency encoding for the RF gradient field.

10. The non-transitory computer-readable storage medium of claim 8, wherein the providing of the excitation pulse comprises designing the $B_1^+$-selective radio frequency (RF) pulse using a Shinnar-Le Roux algorithm.

11. The non-transitory computer-readable storage medium of claim 10, wherein the Shinnar-Le Roux algorithm comprises:
    calculating a duration of a half-pulse and the number of samples in the half-pulse;
    calculating inputs for a finite impulse response (FIR) β filter;
    running an FIR filter design tool to design the FIR β filter;
    sine-modulating coefficients for the FIR β filter to a target passband center;
    scaling to the desired tip angle and divide by the dwell time to get a sampled waveform; and
    building a normalized waveform based on the sampled waveform.

12. The non-transitory computer-readable storage medium of claim 11, further comprising splitting and reflecting the modulated filter.

13. The non-transitory computer-readable storage medium of claim 11, wherein the inputs comprise normalized band edges, an amplitude of frequency response at the normalized band edges, and band error weights.

14. The non-transitory computer-readable storage medium of claim 8, wherein the RF gradient field is generated via modulation of at least one of an amplitude or a frequency of an RF electromagnetic field.

15. A magnetic resonance imaging system comprising:
a plurality of signal generating elements configured for generating radio frequency (RF) fields in a volume of interest;
at least one RF receiver configured for detecting a magnetic resonance (MR) signal from the volume of interest;
a processor communicatively coupled to the plurality of signal generating elements and the at least one RF receiver; and
a non-transitory computer-readable medium having stored thereon a plurality of instructions for causing the processor to perform steps comprising:
configuring the plurality of single generating elements to generating a magnetic resonance (MR) signal for the volume of interest, the generating comprising:
providing an excitation pulse for a volume of interest, the excitation pulse comprising a $B_1^+$-selective radio frequency (RF) pulse, and providing spatial encoding for the volume of interest via an RF gradient field, the RF gradient field configured to provide frequency encoding of spatial location information for spatial locations in the volume of interest;
receiving signals from the at least one RF receiver corresponding to the MR signal; and
reconstructing an image for the volume of interest based on the MR signal.

16. The system of claim 15, wherein the providing of the spatial encoding comprises using Bloch-Siegert shift encoding sequence to provide the frequency encoding for the RF gradient field.

17. The system of claim 15, wherein the providing of the excitation pulse comprises designing the $B_1^+$-selective radio frequency (RF) pulse using a Shinnar-Le Roux algorithm.

18. The system of claim 17, wherein the Shinnar-Le Roux algorithm comprises:
calculating a duration of a half-pulse and the number of samples in the half-pulse;
calculating inputs for a finite impulse response (FIR) β filter;
running an FIR filter design tool to design the FIR β filter;
sine-modulating coefficients for the FIR β filter to a target passband center;
scaling to the desired tip angle and divide by the dwell time to get a sampled waveform; and
building a normalized waveform based on the sampled waveform.

19. The system of claim 18, further comprising splitting and reflecting the modulated filter.

20. The system of claim 15, wherein the RF gradient field is generated via modulation of at least one of an amplitude or a frequency of an RF electromagnetic field.

* * * * *